(12) United States Patent
Son et al.

(10) Patent No.: US 12,146,016 B2
(45) Date of Patent: Nov. 19, 2024

(54) SELF-HEALING CONJUGATED POLYMER, COMPOSITION FOR FORMING SELF-HEALING PHOTOACTIVE LAYER INCLUDING THE CONJUGATED POLYMER AND ORGANIC SOLAR CELL INCLUDING PHOTOACTIVE LAYER FORMED USING THE COMPOSITION

(71) Applicant: KOREA INSTITUTE OF SCIENCE AND TECHNOLOGY, Seoul (KR)

(72) Inventors: Hae Jung Son, Seoul (KR); Eul-Yong Shin, Seoul (KR); Sungmin Park, Seoul (KR); Taehee Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 686 days.

(21) Appl. No.: 17/334,437

(22) Filed: May 28, 2021

(65) Prior Publication Data
US 2022/0025092 A1 Jan. 27, 2022

(30) Foreign Application Priority Data
Jul. 22, 2020 (KR) .......................... 10-2020-0091067

(51) Int. Cl.
  C08F 228/06 (2006.01)
  H10K 30/30 (2023.01)
  H10K 85/10 (2023.01)

(52) U.S. Cl.
  CPC ........... C08F 228/06 (2013.01); H10K 30/30 (2023.02); H10K 85/113 (2023.02)

(58) Field of Classification Search
  CPC ..... C08F 228/06; H10K 30/30; H10K 85/113; H10K 30/50; Y02E 10/549; C09D 133/26; C08G 61/126; C08G 2261/143; C08G 2261/3243; C08G 2261/91
  See application file for complete search history.

(56) References Cited

U.S. PATENT DOCUMENTS

2013/0247992 A1* 9/2013 Drees .................. H10K 85/151
                                                       136/263
2021/0115174 A1* 4/2021 Ree ..................... C09D 133/08

FOREIGN PATENT DOCUMENTS

KR           10-0963467 B1        6/2010

OTHER PUBLICATIONS

Xin Song "Controlling Blend Morphology for Ultrahigh Current Density in Nonfullerene Acceptor-Based Organic Solar Cells" ACS Energy Lett. 2018, 3, 669-676 (Year: 2018) (Year: 2018).*
Keqiang He "A Wide Bandgap Polymer Donor Composed of Benzodithiophene and Oxime-Substituted Thiophene for High-Performance Organic Solar Cells" ACS Appl. Mater. Interfaces 2021, 13, 26441-26450 (Year: 2021).*

* cited by examiner

*Primary Examiner* — Michael Y Sun
(74) *Attorney, Agent, or Firm* — Rabin & Berdo, P.C.

(57) ABSTRACT

A self-healing conjugated polymer is disclosed. The self-healing conjugated polymer has hydrogen bonding functional groups introduced into its side chains. Due to this structure, the conjugated polymer is imparted with the ability to recover through self-healing while maintaining its inherent properties (for example, physical and electrical properties). Based on this effective self-healing ability, the conjugated polymer is expected to find application as a biomaterial, a pharmaceutical material, a nonlinear optical material or an organic electronic material.

11 Claims, 9 Drawing Sheets

SELF-HEALING CONJUGATED POLYMER, COMPOSITION FOR FORMING SELF-HEALING PHOTOACTIVE LAYER INCLUDING THE CONJUGATED POLYMER AND ORGANIC SOLAR CELL INCLUDING PHOTOACTIVE LAYER FORMED USING THE COMPOSITION

CROSS-REFERENCE TO RELATED APPLICATIONS

This application claims priority under 35 U.S.C. § 119 to Korean Patent Application No. 10-2020-0091067 filed on Jul. 22, 2020 in the Korean Intellectual Property Office, the disclosure of which is incorporated herein by reference in its entirety.

BACKGROUND OF THE INVENTION

1. Field of the Invention

The present invention relates to a self-healing conjugated polymer, and more specifically to a conjugated polymer that has the additional function of self-healing while maintaining its electrical and physical properties.

2. Description of the Related Art

Solar cells are photovoltaic devices that convert solar energy into electrical energy. Solar cells have received attention as next-generation energy sources. Solar cells are broadly classified into inorganic and organic solar cells. Organic solar cells are divided into bi-layer p-n junction and bulk heterojunction types by the structure of photoactive layers. In a bi-layer p-n junction type solar cell, a p-type semiconductor layer and an n-type semiconductor layer are separated from each other. In a bulk heterojunction type solar cell, a p-type semiconductor is mixed with an n-type semiconductor to form one layer.

In 1986, C. Tang of Eastman Kodak Co. has first developed heterojunction solar cells using copper phthalocyanine (CuPc) and a perylenetetracarboxylic derivative and proposed their practical applicability. At the beginning of 1990, Heeger's group has reported solar cells in which a film formed using a mixture of a conjugated polymer and a fullerene derivative is used as a photoactive layer to generate electricity and has developed another fullerene derivative (PCBM), achieving an efficiency on the order of 7-8%. Thereafter, a great deal of research has been continuously conducted on highly efficient organic solar cells. Organic solar cells with greatly improved photoelectric conversion efficiency are currently being developed.

Nevertheless, the application of various external stimuli (or forces) such as ultraviolet light, moisture, air or strain to organic solar cells causes the formation of defects such as cracks in photoactive layers, tending to destroy the organic solar cells and deteriorating the electrical properties of the organic solar cells. These problems limit the lifetime of organic solar cells. To overcome this limitation, there is a need to develop a material with improved electrical properties that can effectively heal damage.

Methods for self-healing cracked or damaged polymer materials by substituting or adding other functional groups on or to the polymer chains are known in the art. However, the self-healing methods require the use of additional chemicals or involve very complex and cumbersome processes.

PRIOR ART DOCUMENTS

Patent Documents

1. Korean Patent No. 10-0963467

SUMMARY OF THE INVENTION

One object of the present invention is to provide a conjugated polymer that has excellent mechanical and electrical properties and can self-heal damage.

A further object of the present invention is to provide a composition for forming a photoactive layer whose self-healing ability is maximized, including the conjugated polymer.

Another object of the present invention is to provide a photoactive layer for an organic solar cell with improved long-term stability and lifetime formed using the composition and an organic solar cell employing the photoactive layer.

One aspect of the present invention provides a self-healing conjugated polymer represented by Formula I:

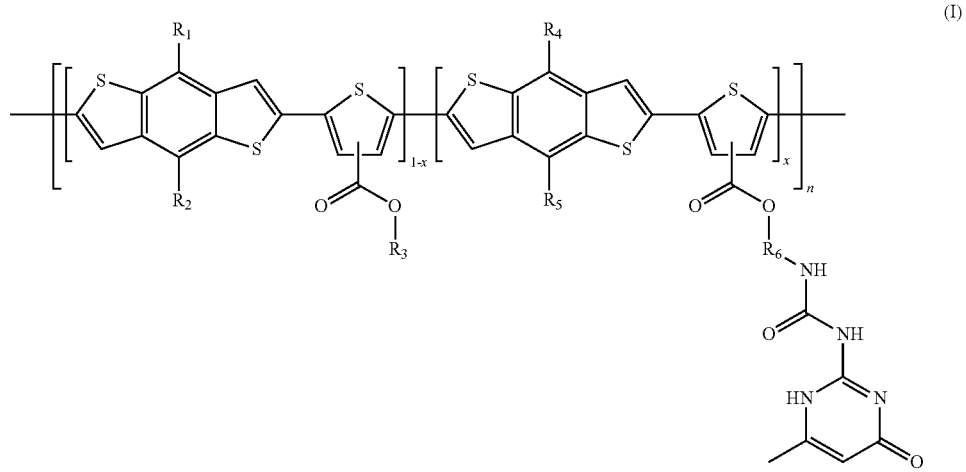

(I)

wherein $R_1$, $R_2$, $R_4$, and $R_5$ may be identical to or different from each other and are each independently a group represented by Structure 1:

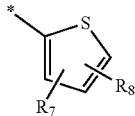

(1)

(wherein $R_7$ and $R_8$ may be identical to or different from each other and are each independently selected from hydrogen atoms, halogen atoms, cyano groups, nitro groups, hydroxyl groups, amide groups, ester groups, ketone groups, thioester groups, silyl groups, and substituted or unsubstituted $C_1$-$C_{30}$ alkyl groups), $R_3$ and $R_6$ may be identical to or different from each other and are each independently selected from the group consisting of substituted or unsubstituted $C_1$-$C_{30}$ alkyl groups, substituted or unsubstituted $C_5$-$C_{35}$ alkylthionyl groups, and substituted or unsubstituted $C_3$-$C_{30}$ cycloalkyl groups, x and y satisfy $0.1 \leq x \leq 0.9$, $0.1 \leq y \leq 0.9$, and $x+y=1$, and n is an integer from 5 to 100,000.

The conjugated polymer may have a number average molecular weight ($M_n$) of 1 to 100 kg/mol.

The conjugated polymer may have a polydispersity (PD) ($M_w/M_n$) of 1 to 3.

In Formula I, x and y may satisfy $0.8 \leq x \leq 0.9$, $0.1 \leq y \leq 0.2$, and $x+y=1$.

A further aspect of the present invention provides a composition for forming a self-healing photoactive layer, including a solvent and a conjugated polymer represented by Formula I:

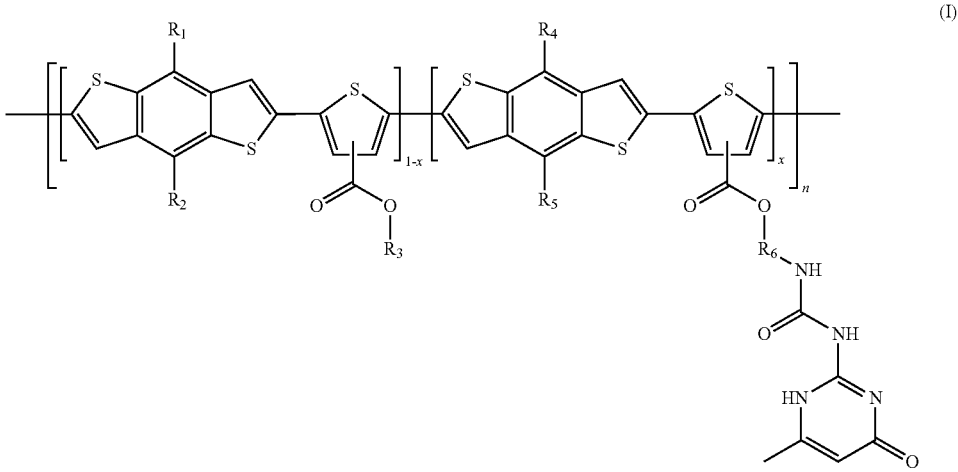

(I)

wherein $R_1$, $R_2$, $R_4$, and $R_5$ may be identical to or different from each other and are each independently a group represented by Structure 1:

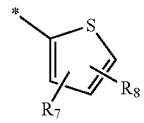

(1)

(wherein $R_7$ and $R_8$ may be identical to or different from each other and are each independently selected from hydrogen atoms, halogen atoms, cyano groups, nitro groups, hydroxyl groups, amide groups, ester groups, ketone groups, thioester groups, silyl groups, and substituted or unsubstituted $C_1$-$C_{30}$ alkyl groups), $R_3$ and $R_6$ may be identical to or different from each other and are each independently selected from the group consisting of substituted or unsubstituted $C_1$-$C_{30}$ alkyl groups, substituted or unsubstituted $C_5$-$C_{35}$ alkylthionyl groups, and substituted or unsubstituted $C_3$-$C_{30}$ cycloalkyl groups, x and y satisfy $0.1 \leq x \leq 0.9$, $0.1 \leq y \leq 0.9$, and $x+y=1$, and n is an integer from 5 to 100,000.

The solvent may be selected from the group consisting of dimethylformamide, dichloromethane, chloroform, hexane, cyclohexane, toluene, xylene, chlorobenzene, dichlorobenzene, ethylene acetate, tetrahydrofuran, N-methylpyrrolidinone, and mixtures thereof.

The composition may further include n-type molecules. The n-type molecules may be selected from the group consisting of 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC), 3,9-bis(2-methylene-(5,6-difluoro-3-oxo-2,3-dihydro-1H-inden-1-ylidene)malononitrile)-5,5,11,11-tetrakis(4-hexylphenyl)-dithieno[2,3-d:2',3'-d']-s-indaceno[1,2-b:5,6-b']dithiophene (IT-4F), (5Z,5'Z)-5,5'-(((4,4,9,9-tetraoctyl-4,9-dihydro-s-indaceno[1,2-b:5,6-b']dithiophene-2,7-diyl)bis(benzo[c][1,2,5]thiadiazole-7,4-diyl))bis(methanylylidene))bis(3-ethyl-2-thioxothiazolidin-4-one) (O-IDTBR), 2,2'-((2Z,2'Z)-(((4,4,9,9-tetrakis(4-hexylphenyl)-4,9-dihydro-sindaceno[1,2-b:5,6-b']dithiophene-2,7-diyl)bis(4-((2-ethylhexyl)oxy)thiophene-5,2-diyl))bis(methanylylidene))bis(5,6-difluoro-3-oxo-2,3-dihydro-1H-indene-2,1-diylidene))dimalononitrile (IEICO-4F), 5,5'-(9,9'-spirobi

[fluorene]-2,7-diyl)bis(2,9-dimethylanthra[2,1,9-def:6,5,10-d'e'f]diisoquinoline-1,3,8,10(2H,9H)-tetraone) (SF-PDI$_2$), (2,20-((2Z,20Z)-((12,13-bis(2-ethylhexyl)-3,9-diundecyl-12,13-dihydro-[1,2,5]thiadiazolo[3,4-e]thieno[2",3': 4',5'] thieno[2',3': 4,5]pyrrolo[3,2-g]thieno[2',3': 4,5]thieno[3,2-b]indole-2,10-diyl)bis(methanylylidene))bis(5,6-difluoro-3-oxo-2,3-dihydro-1H-indene-2,1-diylidene))dimalononitrile) (Y6), (6,6)-phenyl-C61-butyric acid methyl ester ($C_{60}$-PCBM), (6,6)-phenyl-C71-butyric acid methyl ester ($C_{70}$-PCBM), bis(1-[3-(methoxycarbonyl)propyl]-1-phenyl) (Bis-$C_{60}$-PCBM), 3'-phenyl-3'H-cyclopropa(8,25)(5,6) fullerene-C70-bis-D5h(6)-3'-butyric acid methyl ester (Bis-$C_{70}$-PCBM), indene-C60-bisadduct (ICBA), monoindenyl C60 (ICMA) molecules, and combinations thereof.

Another aspect of the present invention provides a photoactive layer for an organic solar cell including the composition.

Yet another aspect of the present invention provides an organic solar cell employing the photoactive layer.

The organic solar cell includes a substrate, a first electrode disposed on the substrate, a buffer layer disposed on the first electrode, the photoactive layer disposed on a charge transport layer, and a second electrode disposed on the photoactive layer.

The introduction of hydrogen bonding functional groups into the side chains of the conjugated polymer according to the present invention imparts the conjugated polymer with the ability to recover through self-healing while maintaining the inherent properties (for example, physical and electrical properties) of the conjugated polymer. Based on this effective self-healing ability, the conjugated polymer is expected to find application as a biomaterial, a pharmaceutical material, a nonlinear optical material or an organic electronic material.

In addition, the structurally novel conjugated polymer of the present invention suffers little damage from external stimuli and can self-heal damage due to its maximized electrical and physical properties. Therefore, the use of the conjugated polymer according to the present invention ensures significantly improved lifetime and long-term stability of the organic solar cell.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
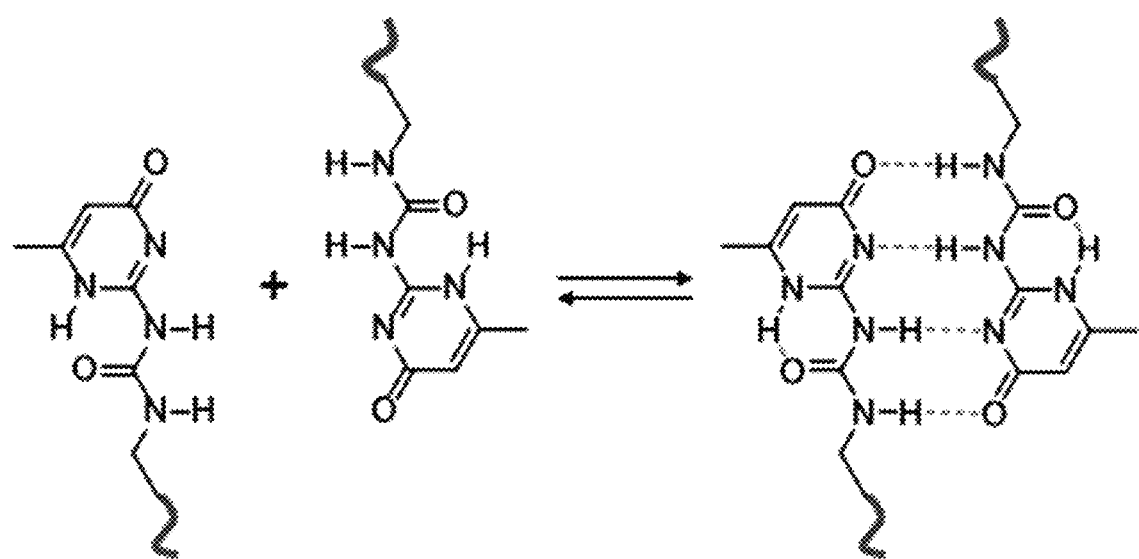
FIG. 1 shows the mechanism of self-healing of a conjugated polymer according to the present invention.

Several aspects and various embodiments of the present invention will now be described in more detail.

The inventors of the present invention have conducted research to develop a self-healing conjugated polymer material with excellent electrical and optical properties, and as a result, found that a novel, structurally stable conjugated polymer material having self-healing properties as well as excellent electrical and optical properties can be prepared by reaction of a benzodithiophene compound with a thiophene compound containing urea moieties. The present invention has been accomplished based on this finding.

One aspect of the present invention is directed to a self-healing conjugated polymer represented by Formula I:

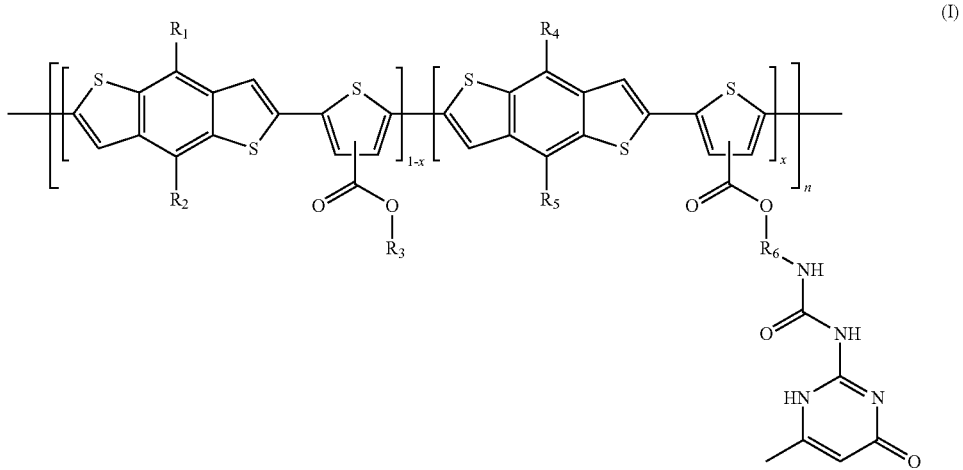

wherein $R_1$, $R_2$, $R_4$, and $R_5$ may be identical to or different from each other and are each independently a group represented by Structure 1:

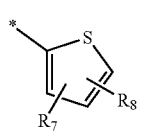

(wherein $R_7$ and $R_8$ may be identical to or different from each other and are each independently selected from hydrogen atoms, halogen atoms, cyano groups, nitro groups, hydroxyl groups, amide groups, ester groups, ketone groups, thioester groups, silyl groups, and substituted or unsubstituted $C_1$-$C_{30}$ alkyl groups), $R_3$ and $R_6$ may be identical to or different from each other and are each independently selected from the group consisting of substituted or unsubstituted $C_1$-$C_{30}$ alkyl groups, substituted or unsubstituted $C_5$-$C_{35}$ alkylthionyl groups, and substituted or unsubstituted $C_3$-$C_{30}$ cycloalkyl groups, x and y satisfy $0.1 \leq x \leq 0.9$, $0.1 \leq y \leq 0.9$, and x+y=1, and n is an integer from 5 to 100,000.

As used herein, the term "substituted" refers to substitution with one substituent selected from the group consisting of hydrogen atoms, halogen atoms, linear or branched $C_1$-$C_{20}$ alkyl groups, and linear or branched $C_3$-$C_{20}$ cycloalkyl groups, preferably a linear or branched $C_1$-$C_{20}$ alkyl group, more preferably a linear $C_1$-$C_{10}$ alkyl group.

The halogen group may be selected from the group consisting of fluoro, chloro, bromo, and iodo.

Preferably, $R_7$ and $R_8$ in Structure 1 are identical to or different from each other and are each independently selected from hydrogen atoms, halogen groups, amide groups, ester groups, ketone groups, thioester groups, silyl groups, and substituted or unsubstituted $C_1$-$C_{20}$ alkyl groups.

Either one of $R_7$ and $R_8$ in Structure 1 is preferably a halogen group, most preferably fluoro (F) that is effective in lowering the HOMO level, and the other is preferably a substituted or unsubstituted $C_1$-$C_{30}$ alkyl group. For example, when $R_7$ is a halogen group, $R_8$ may be a substituted or unsubstituted $C_1$-$C_{30}$ alkyl group. When $R_8$ is a halogen group, $R_7$ may be a substituted or unsubstituted $C_1$-$C_{30}$ alkyl group. When either one of $R_7$ and $R_8$ is fluoro (F), the other is more preferably a linear or branched $C_2$-$C_{10}$ alkyl group in that the distortion of the skeleton is suppressed without impairing the carrier mobility of the conjugated polymer to ensure better packing, and at the same time, the open-circuit voltage and short-circuit current of an organic solar cell including a photoactive layer formed using the conjugated polymer are maintained at high levels.

In Formula I, $R_1$, $R_2$, $R_4$, and $R_5$ may be the same as or different from each other. $R_1$, $R_2$, $R_4$, and $R_5$ may be independently different from each other but they are preferably identical to each other. When $R_1$, $R_2$, $R_4$, and $R_5$ are identical to each other, an effective carrier mobility of the conjugated polymer is obtained, achieving improved power conversion efficiency of an organic solar cell including a photoactive layer formed using the conjugated polymer.

In Formula I, $R_3$ and $R_6$ may be identical to or different from each other and are each independently a substituted or unsubstituted $C_1$-$C_{20}$ alkyl group, more preferably a $C_1$-$C_{10}$ alkyl group.

In Formula I, x and y satisfy $0.1 \leq x \leq 0.9$, $0.1 \leq y \leq 0.9$, and x+y=1, preferably $0.2 \leq x \leq 0.9$, $0.1 \leq y \leq 0.8$, more preferably $0.4 \leq x \leq 0.9$ and $0.1 \leq y \leq 0.6$. In Formula I, n is an integer from 5 to 100,000.

When x, y, and n in Formula I satisfy the respective ranges defined above, an organic solar cell including a photoactive layer formed using the conjugated polymer can maintain its energy efficiency for a long period of time and does not undergo a drastic reduction in lifetime even when damaged by external impact and stress.

Particularly, the conjugated polymer of the present invention not only has self-healing properties (fast self-healing and restoration), but also can achieve an appropriate level of energy efficiency of an organic solar cell. Therefore, the conjugated polymer of the present invention is considered very efficient in terms of cost.

It is most preferable that x and y in Formula I satisfy $0.8 \leq x \leq 0.9$, $0.1 \leq y \leq 0.2$, and x+y=1, because the highest energy efficiency (10-7%) of an organic solar cell can be maintained.

The conjugated polymer has a number average molecular weight ($M_n$) of 1 to 100 kg/mol, preferably 5 to 50 kg/mol, 5 to 20 kg/mol or 6 to 15 kg/mol. When the number average molecular weight of the conjugated polymer is adjusted to 6 kg/mol or more, the heat resistance, crack resistance, and adhesiveness of a photoactive layer formed using the conjugated polymer can be improved. Meanwhile, when the number average molecular weight of conjugated polymer is adjusted to 15 kg/mol or less, the compatibility of the conjugated polymer with other components such as n-type molecules in a photoactive layer formed using the conjugated polymer is improved.

The conjugated polymer has a polydispersity (PD) ($M_w/M_n$) of 1 to 10, preferably 1 to 5, more preferably 1 to 3. When the polydispersity of the conjugated polymer is 1 to 3, the conjugated polymer can be effectively imparted with self-healing properties without impairing its inherent characteristics and material characteristics.

As used herein, the term "self-healing" means that the physical properties of a coating layer or thin film formed using the conjugated polymer can be restored from damage (for example, cracking, fracture or breakage) caused by stress.

A further aspect of the present invention is directed to a method for preparing a conjugated polymer represented by Formula I:

(wherein $R_7$ and $R_8$ may be identical to or different from each other and are each independently selected from hydrogen atoms, halogen atoms, cyano groups, nitro groups, hydroxyl groups, amide groups, ester groups, ketone groups, thioester groups, silyl groups, and substituted or unsubstituted $C_1$-$C_{30}$ alkyl groups), $R_3$ and $R_6$ may be identical to or different from each other and are each independently selected from the group consisting of substituted or unsubstituted $C_1$-$C_{30}$ alkyl groups, substituted or unsubstituted $C_5$-$C_{35}$ alkylthionyl groups, and substituted or unsubstituted $C_3$-$C_{30}$ cycloalkyl groups, x and y satisfy $0.1 \leq x \leq 0.9$, $0.1 \leq y \leq 0.9$, and $x+y=1$, and n is an integer from 5 to 100,000, the method including a) mixing a compound represented by Formula II:

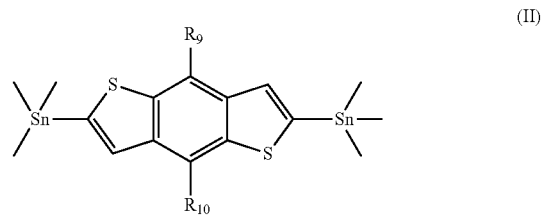

(II)

wherein $R_9$ and $R_{10}$ may be identical to or different from each other and are as defined for $R_1$, $R_2$, $R_4$, and $R_5$ in Formula I, a compound represented by Formula III:

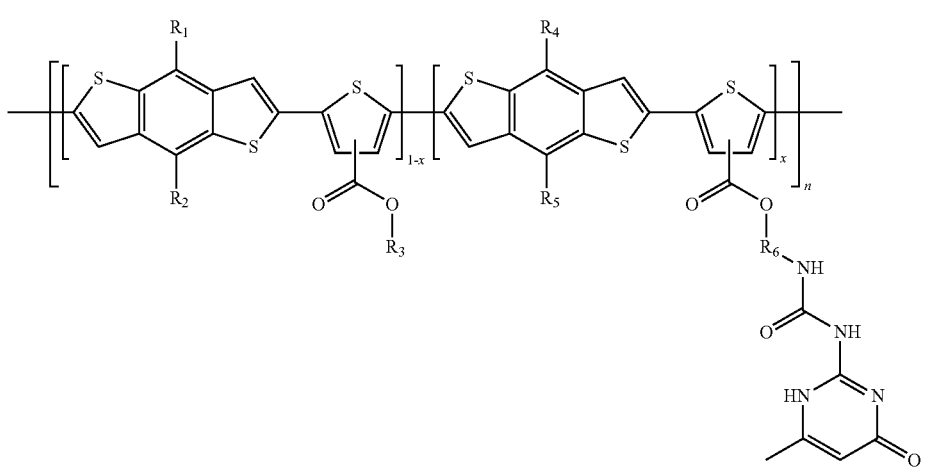

(I)

wherein $R_1$, $R_2$, $R_4$, and $R_5$ may be identical to or different from each other and are each independently a group represented by Structure 1:

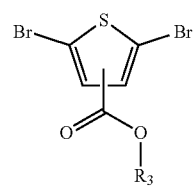

(III)

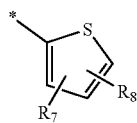

(1)

wherein $R_3$ is as defined in Formula I, and a compound represented by Formula IV:

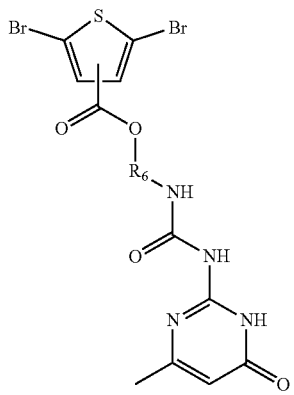

(IV)

wherein $R_6$ is as defined in Formula I, in a solvent to prepare a solution, and b) adding a catalyst to the solution, followed by polymerization.

The conjugated polymer represented by Formula (I) has been specifically described above, and thus the above description is referred to for sufficient understanding.

The halogen group may be selected from the group consisting of fluoro, chloro, bromo, and iodo.

Preferably, $R_7$ and $R_8$ in Structure 1 are identical to or different from each other and are each independently selected from hydrogen atoms, halogen groups, amide groups, ester groups, ketone groups, thioester groups, silyl groups, and substituted or unsubstituted $C_1$-$C_{20}$ alkyl groups.

Either one of $R_7$ and $R_8$ in Structure 1 is preferably a halogen group, most preferably fluoro (F) that is effective in lowering the HOMO level, and the other is preferably a substituted or unsubstituted $C_1$-$C_{30}$ alkyl group. For example, when $R_7$ is a halogen group, $R_8$ may be a substituted or unsubstituted $C_1$-$C_{30}$ alkyl group. When $R_8$ is a halogen group, $R_7$ may be a substituted or unsubstituted $C_1$-$C_{30}$ alkyl group. When either one of $R_7$ and $R_8$ is fluoro (F), the other is more preferably a linear or branched $C_2$-$C_{10}$ alkyl group in that the distortion of the skeleton is suppressed without impairing the carrier mobility of the conjugated polymer to ensure better packing, and at the same time, the open-circuit voltage and short-circuit current of an organic solar cell including a photoactive layer formed using the conjugated polymer are maintained at high levels.

In Formula I, $R_1$, $R_2$, $R_4$, and $R_5$ may be the same as or different from each other. $R_1$, $R_2$, $R_4$, and $R_5$ may be independently different from each other but they are preferably identical to each other. When $R_1$, $R_2$, $R_4$, and $R_5$ are identical to each other, an effective carrier mobility of the conjugated polymer is obtained, achieving improved power conversion efficiency of an organic solar cell including a photoactive layer formed using the conjugated polymer.

In Formula I, $R_3$ and $R_6$ may be identical to or different from each other and are each independently a substituted or unsubstituted $C_1$-$C_{20}$ alkyl group, more preferably a $C_1$-$C_{10}$ alkyl group.

It is preferable that x and y in Formula I satisfy 0.8≤x≤0.9, 0.1≤y≤0.2, and x+y=1. When x and y in Formula I satisfy the respective ranges defined above, the conjugated polymer not only has self-healing properties (fast self-healing and restoration), but also can achieve a high energy efficiency (10-7%) of an organic solar cell. Therefore, the conjugated polymer of the present invention is considered very efficient in terms of effect and cost.

In step a), the molar ratio of the compound of Formula II, the compound of Formula III, and the compound of Formula IV can be appropriately selected depending on the desired molar fractions x and y. The molar ratio is preferably 1:0.1-0.9:0.1-0.9, more preferably 1:0.8-0.9:0.1-0.2.

The solvent used in step a) may be any organic solvent capable of dissolving the compound of Formula II, the compound of Formula III, and the compound of Formula IV. Specifically, the solvent is selected from the group consisting of, but not limited to, chloroform, methylene chloride, 1,2-dichloroethane, 1,1,2-trichloroethane, toluene, xylene, chlorobenzene, o-dichlorobenzene, N-methyl-2-pyrrolidone (NMP), dimethylformamide (DMF), dimethyl acetamide (DMAC), dimethyl sulfoxide (DMSO), isopropyl alcohol, and mixtures thereof.

Step b) is preferably carried out in the temperature range of 100 to 300° C., more preferably 120 to 220° C.

Step b) is carried out in a microwave polymerization reactor for 0.1 to 10 hours, preferably 0.5 to 5 hours, more preferably 1 to 3 hours.

The catalyst may be at least one palladium catalyst selected from the group consisting of $PdCl_2$, $Pd(OAc)_2$, $Pd(CH_3CN)_2Cl_2$, $Pd(PhCN)_2Cl_2$, $Pd_2(dba)_3$, $(P(o\text{-tolyl})_3)$, and $Pd(PPh_3)_4$.

The compound represented by Formula IV can be prepared by a method including 1) reacting the compound represented by Formula V:

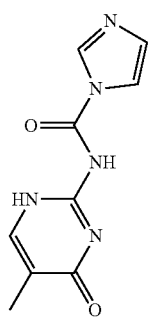

(V)

with a compound represented by Formula VI:

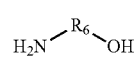

(VI)

wherein $R_6$ is selected from the group consisting of substituted or unsubstituted $C_1$-$C_{30}$ alkyl groups, substituted or unsubstituted $C_5$-$C_{35}$ alkylthionyl groups, and substituted or unsubstituted $C_3$-$C_{30}$ cycloalkyl groups, preferably a substituted or unsubstituted $C_1$-$C_{20}$ alkyl group, more preferably a $C_1$-$C_{10}$ alkyl group, to prepare a compound represented by Formula VII:

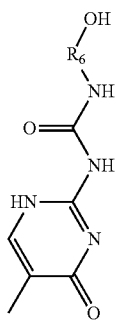

(VII)

wherein R$_6$ is as defined in Formula VI, and 2) reacting the compound of Formula VII with 2,5-dibromothiophene-3-carboxylic acid.

In step 1), the compound represented by Formula V may react with the compound represented by Formula VI in a molar ratio of 1:1-2.

In step 2), the compound represented by Formula VI may react with 2,5-dibromothiophene-3-carboxylic acid in a molar ratio of 1:1-2.

Step 2) may be carried out in the presence of an organic amine catalyst and a condensing agent. The organic amine catalyst can be selected from the group consisting of triethylamine (TEA), diisopropylethylamine (DIPEA), 4-dimethylaminopyridine (DMAP), and mixtures thereof. The organic amine catalyst is preferably 4-dimethylaminopyridine (DMAP).

The 2,5-dibromothiophene-3-carboxylic acid and the organic amine catalyst are used in a molar ratio of 1:0.05-0.5, preferably 1:0.1-0.3.

The condensing agent can be selected from the group consisting of N,N,N',N'-tetramethyl-(benzotriazol-1-yl)uronium tetrafluoroborate (TBTU), N-(3-dimethylaminopropyl)-N'-ethylcarbodiimide (EDC), N,N'-diisopropylcarbodiimide (DIC), N,N'-dicyclohexylcarbodiimide (DCC), and mixtures thereof. The condensing agent is preferably N-(3-dimethylaminopropyl)-N'-ethylcarbodiimide (EDC).

The 2,5-dibromothiophene-3-carboxylic acid and the condensing agent are used in a molar ratio of 1:1-2, preferably 1:1-1.5.

Each of steps a) and b) may be carried out in a polymerization solvent. The solvent used in step a) may be the same as or different from the solvent used in step b). The solvent used in step a) is not particularly limited as long as it can dissolve the compound represented by Formula V and the compound represented by Formula VI. Specifically, the solvent used in step a) can be selected from the group consisting of, but not limited to, chloroform, methylene chloride, 1,2-dichloroethane, 1,1,2-trichloroethane, chlorobenzene, o-dichlorobenzene, N-methyl-2-pyrrolidone (NMP), dimethylformamide (DMF), dimethylacetamide (DMAC), dimethyl sulfoxide (DMSO), isopropyl alcohol, and mixtures thereof.

Another aspect of the present invention is directed to a composition for forming a self-healing photoactive layer, including a solvent and a conjugated polymer represented by Formula I:

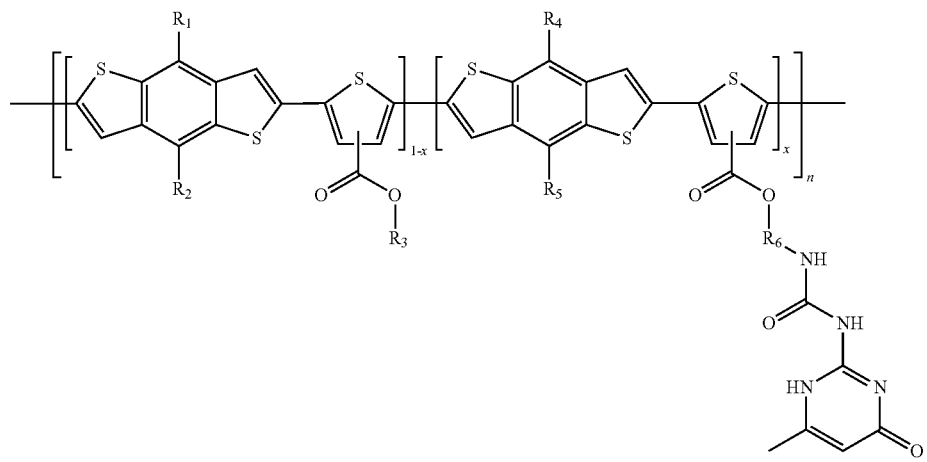

(I)

wherein R$_1$, R$_2$, R$_4$, and R$_5$ may be identical to or different from each other and are each independently a group represented by Structure 1:

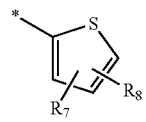

(1)

(wherein R$_7$ and R$_8$ may be identical to or different from each other and are each independently selected from hydrogen atoms, halogen atoms, cyano groups, nitro groups, hydroxyl groups, amide groups, ester groups, ketone groups, thioester groups, silyl groups, and substituted or unsubstituted C$_1$-C$_{30}$ alkyl groups), R$_3$ and R$_6$ may be identical to or different from each other and are each independently selected from the group consisting of substituted or unsubstituted C$_1$-C$_{30}$ alkyl groups, substituted or unsubstituted C$_5$-C$_{35}$ alkylthionyl groups, and substituted or unsubstituted C$_3$-C$_{30}$ cycloalkyl groups, x and y satisfy $0.1 \leq x \leq 0.9$, $0.1 \leq y \leq 0.9$, and $x+y=1$, and n is an integer from 5 to 100,000.

The solvent can be selected from the group consisting of dimethylformamide, dichloromethane, chloroform, hexane, cyclohexane, toluene, xylene, chlorobenzene, dichlorobenzene, ethylene acetate, tetrahydrofuran, N-methylpyrrolidinone, and mixtures thereof.

The composition may further include n-type molecules. The n-type molecules can be selected from the group consisting of 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC), 3,9-bis(2-methylene-(5,6-difluoro-3-oxo-2,3-dihydro-1H-inden-1-ylidene)malononitrile)-5,5,11,11-tetrakis(4-hexylphenyl)-dithieno[2,3-d:2',3'-d']-s-indaceno[1,2-b:5,6-b']dithiophene (IT-4F), (5Z,5'Z)-5,5'-(((4,4,9,9-tetraoctyl-4,9-dihydro-s-indaceno[1,2-b:5,6-b']dithiophene-2,7-diyl)bis(benzo[c][1,2,5]thiadiazole-7,4-diyl))bis(methanylylidene))bis(3-ethyl-2-thioxothiazolidin-4-one) (O-IDTBR), 2,2'-((2Z,2'Z)-(((4,4,9,9-tetrakis(4-hexylphenyl)-4,9-dihydro-sindaceno[1,2-b:5,6-b']dithiophene-2,7-diyl)bis(4-((2-ethylhexyl)oxy)thiophene-5,2-diyl))bis(methanylylidene)) bis(5,6-difluoro-3-oxo-2,3-dihydro-1H-indene-2,1-diylidene))dimalononitrile (IEICO-4F), 5,5'-(9,9'-spirobi[fluorene]-2,7-diyl)bis(2,9-dimethylanthra[2,1,9-def:6,5,10-d'e'f']diisoquinoline-1,3,8,10(2H,9H)-tetraone) (SF-PDI$_2$), (2,20-((2Z,20Z)-((12,13-bis(2-ethylhexyl)-3,9-diundecyl-12,13-dihydro-[1,2,5]thiadiazolo[3,4-e]thieno[2'',3'':4',5'] thieno[2',3':4,5]pyrrolo[3,2-g]thieno[2',3':4,5]thieno[3,2-b] indole-2,10-diyl)bis(methanylylidene))bis(5,6-difluoro-3-oxo-2,3-dihydro-1H-indene-2,1-diylidene))dimalononitrile) (Y6), (6,6)-phenyl-C61-butyric acid methyl ester ($C_{60}$-PCBM), (6,6)-phenyl-C71-butyric acid methyl ester ($C_{70}$-PCBM), bis(1-[3-(methoxycarbonyl)propyl]-1-phenyl) (Bis-$C_{60}$-PCBM), 3'-phenyl-3'H-cyclopropa(8,25)(5,6) fullerene-C70-bis-D5h(6)-3'-butyric acid methyl ester (Bis-$C_{70}$-PCBM), indene-C60-bisadduct (ICBA), monoindenyl C60 (ICMA) molecules, and combinations thereof.

The present invention also provides a photoactive layer for an organic solar cell formed using the composition.

According to a specific embodiment of the present invention, when external stress is applied, shallow and small microcracks are formed in the photoactive layer of the present invention due to the enhanced physical properties of the photoactive layer compared to in conventional photoactive layers. At this time, since even simple removal of the external stress (e.g., external force or stretching stress) allows self-healing to start, the photoactive layer of the present invention can be recovered and restored from the physical damage in a short time. That is, the photoactive layer of the present invention undergoes much less physical damage and self-heals physical damage more rapidly, enabling recovery and restoration of its physical and electrical properties, than conventional photoactive layers under the same external stress conditions (e.g., stretching), which can be confirmed through the following experimental examples.

According to a specific embodiment of the present invention, the photoactive layer of the present invention can be restored through self-healing simply by removal of external force without the need for any additional treatment such as heat treatment, unlike conventional self-healing photoactive layers.

According to a specific embodiment of the present invention, after microscale cracks are formed in the photoactive layer by an external force, 60 to 99% of the damaged photoactive layer is recovered through self-healing over time or by heat treatment, as observed with an optical microscope.

According to a specific embodiment of the present invention, the photoactive layer may be formed as a thin film by a method selected from the group consisting of vacuum deposition, screen printing, printing, bar coating, blade coating, slot die coating, spin coating, dipping, and ink spraying.

The present invention also provides an organic solar cell employing the photoactive layer.

According to a specific embodiment of the present invention, the organic solar cell includes a substrate, a first electrode disposed on the substrate, a buffer layer disposed on the first electrode, the photoactive layer disposed on a charge transport layer, and a second electrode disposed on the photoactive layer.

According to a specific embodiment of the present invention, the buffer layer may include polyethylenimine ethoxylated (PEIE), zinc oxide (ZnO) or polystyrene sulfonate-doped poly(3,4-ethylenedioxythiophene) (PEDOT:PSS).

According to a specific embodiment of the present invention, the first and second electrodes may be made of the same or different materials and may be each independently selected from the group consisting of indium tin oxide (ITO), fluorinated tin oxide (FTO), indium zinc oxide (IZO), Al-doped zinc oxide (AZO), indium zinc tin oxide (IZTO), $SnO_2$, ZnO, carbon nanotube, graphene, $TiO_2$, $MoO_3$, $V_2O_5$, Ca, LiF, gold, platinum, silver, aluminum, nickel, chromium electrodes, and combinations thereof.

According to a specific embodiment of the present invention, the substrate may be selected from the group consisting of glass, polydimethylsiloxane (PDMS), polyethylene naphthalate (PEN), polyethylene terephthalate (PET), polycarbonate (PC), polyvinyl alcohol (PVA), polyacrylate, polyimide (PI), polynorbornene, and polyethersulfone (PES) substrates.

The following examples are provided to assist in further understanding of the present invention. However, these examples are provided for illustrative purposes only and the scope of the present invention is not limited thereto. It will be evident to those skilled in the art that various modifications and changes can be made without departing from the scope and spirit of the present invention.

Example 1-1. Synthesis of the Conjugated Polymer Represented by Formula 1 (PTO2-Urea10)

The conjugated polymer represented by Formula 1 (PTO2-urea10) was prepared according to Scheme 1:

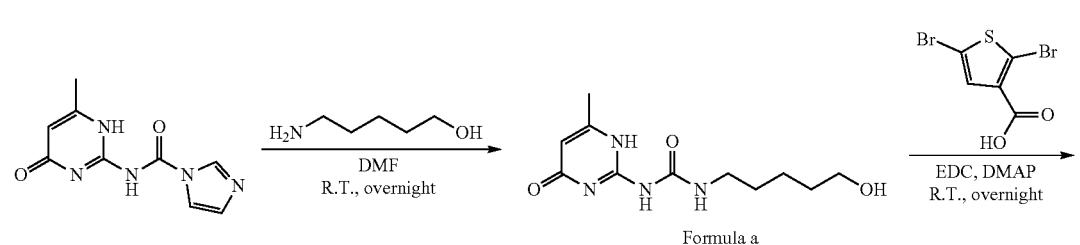
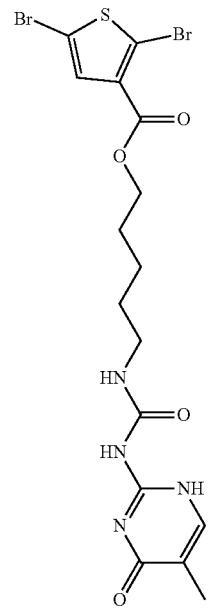
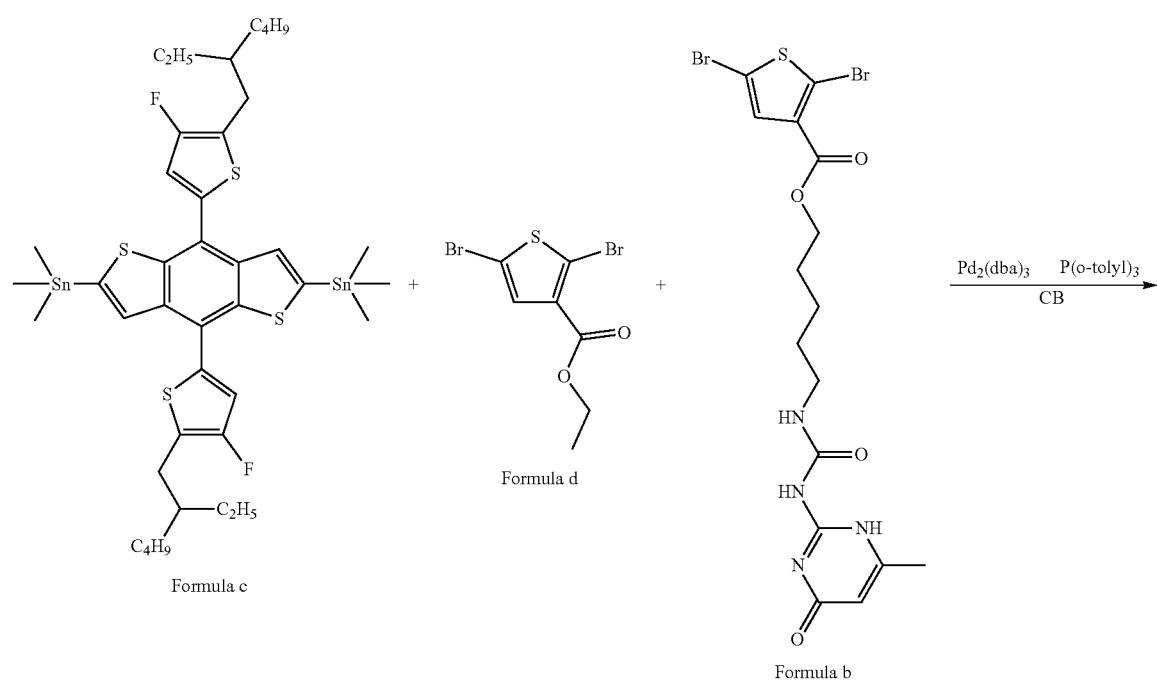

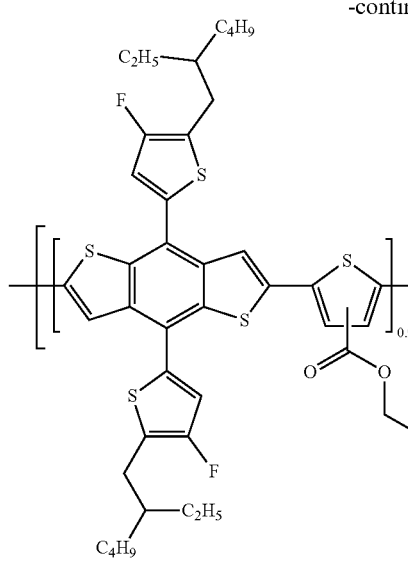
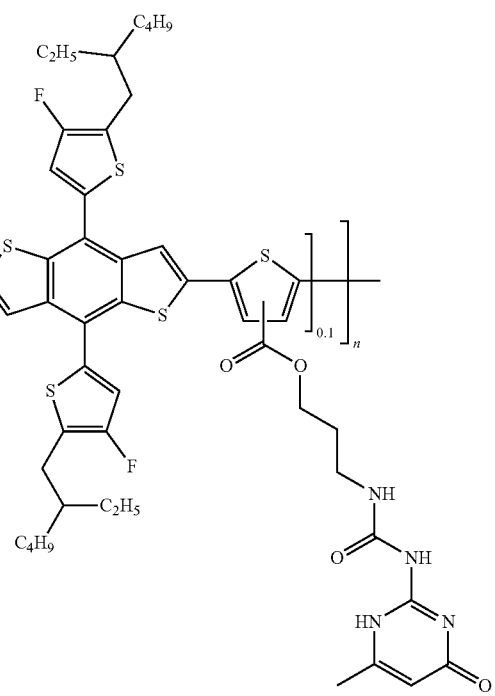

PTO2-urea 10
[Formula 1]

(1) Synthesis of the Compound Represented by Formula a

N-(6-methyl-4-oxo-1,4-dihydropyrimidin-2-yl)-1H-imidazole-1-carboxamide (502 mg, 2.29 mol) and 5-aminopentan-1-ol (283.2 mg, 2.75 mmol) were mixed and dissolved in anhydrous dimethylformamide (DMF, 2.3 mL). The solution was allowed to react sufficiently at room temperature, precipitated in acetone, and filtered to afford 422.5 mg (72.6% yield) of 1-(5-hydroxypentyl)-3-(6-methyl-4-oxo-1,4-dihydropyrimidin-2-yl)urea represented by Formula a.

$^1$H NMR (400 MHz, CDCl$_3$) δ (ppm): 13.25 (s, 1H), 11.83 (s, 1H), 9.98 (s, 1H), 5.89 (s, 1H), 3.71 (t, 2H), 3.32 (q, 2H), 2.25 (s, 3H), 1.80-1.45 (m, 6H).

(2) Synthesis of the Compound Represented by Formula b 2,5-Dibromothiophene-3-carboxylic acid (712.6 mg, 2.49 mmol), the compound (422.5 mg, 1.66 mmol) represented by Formula a, 1-ethyl-3-(3-dimethylaminopropyl)carbodiimide (386.9 mg, 2.49 mmol), and 4-dimethylaminopyridine (40.6 mg, 0.33 mmol) were dissolved in anhydrous tetrahydrofuran (THF, 16.6 mL). The solution was allowed to react sufficiently under reflux. The reaction solution was added with a 1 M hydrochloric acid solution, extracted with chloroform, precipitated in acetone, and filtered to afford 374 mg (43.1% yield) of 5-(3-(5-methyl-4-oxo-1,4-dihydropyrimidin-2-yl)ureido)pentyl 2,5-dibromothiophene-3-carboxylate represented by Formula b.

$^1$H NMR (400 MHz, CDCl$_3$) δ (ppm): 13.12 (s, 1H), 11.88 (s, 1H), 10.25 (s, 1H), 7.35 (s, 1H), 5.83 (s, 1H), 4.31 (t, 2H), 3.32 (q, 2H), 2.26 (s, 3H), 1.88-1.48 (m, 6H).

(3) Synthesis of the Conjugated Polymer (PTO2-Urea10) Represented by Formula 1

The compound (10.4 mg, 0.02 mmol) represented by Formula b synthesized in (2) of Example 1-1, (4,8-bis(5-(2-ethylhexyl)-4-fluorothiophen-2-yl)benzo[1,2-b:4,5-b']dithiophene-2,6-diyl)bis(trimethylstannane) (188.1 mg, 0.2 mmol) represented by Formula c, ethyl 2,5-dibromothiophene-3-carboxylate (56.5 mg, 0.18 mmol) represented by Formula d, tris(dibenzylideneacetone)dipalladium(0) (Pd$_2$(dba)$_3$) (3.7 mg, 4.0 mol), and tri-o-tolylphosphine (P(o-tolyl)$_3$) (9.7 mg, 32.0 μmol) were mixed and dissolved in degassed chlorobenzene (0.6 ml). The solution was allowed to react in a microwave polymerization reactor at 160° C. for 2 h, precipitated in methanol, and filtered. The precipitate was washed by Soxhlet extraction with methanol, hexane, and cyclohexane in this order, followed by extraction with chloroform. Chloroform was removed from the extract using a rotary evaporator. Then, the extract was precipitated with methanol and filtered to afford the conjugated polymer (PTO2-urea10) (141 mg, 89.5%) represented by Formula 1.

The conjugated polymer (PTO2-urea10) represented by Formula 1 was dissolved in warm chloroform or a mixture of chlorobenzene (CB) and 1,2-dichlorobenzene (DCB) at room temperature.

The molecular weight of the conjugated polymer (PTO2-urea10) represented by Formula 1 was analyzed by gel permeation chromatography (GPC) using 1,2-dichlorobenzene as the eluent at 80° C. The $M_n$ and $M_w/M_n$ of the conjugated polymer (PTO2-urea10) represented by Formula 1 were 10.4 kg/mol and 1.78, respectively.

Example 2-1. Synthesis of the Polymer (PTO2-Urea20) Represented by Formula 2

The polymer (PTO2-urea20) represented by Formula 2 was prepared according to Scheme 2:

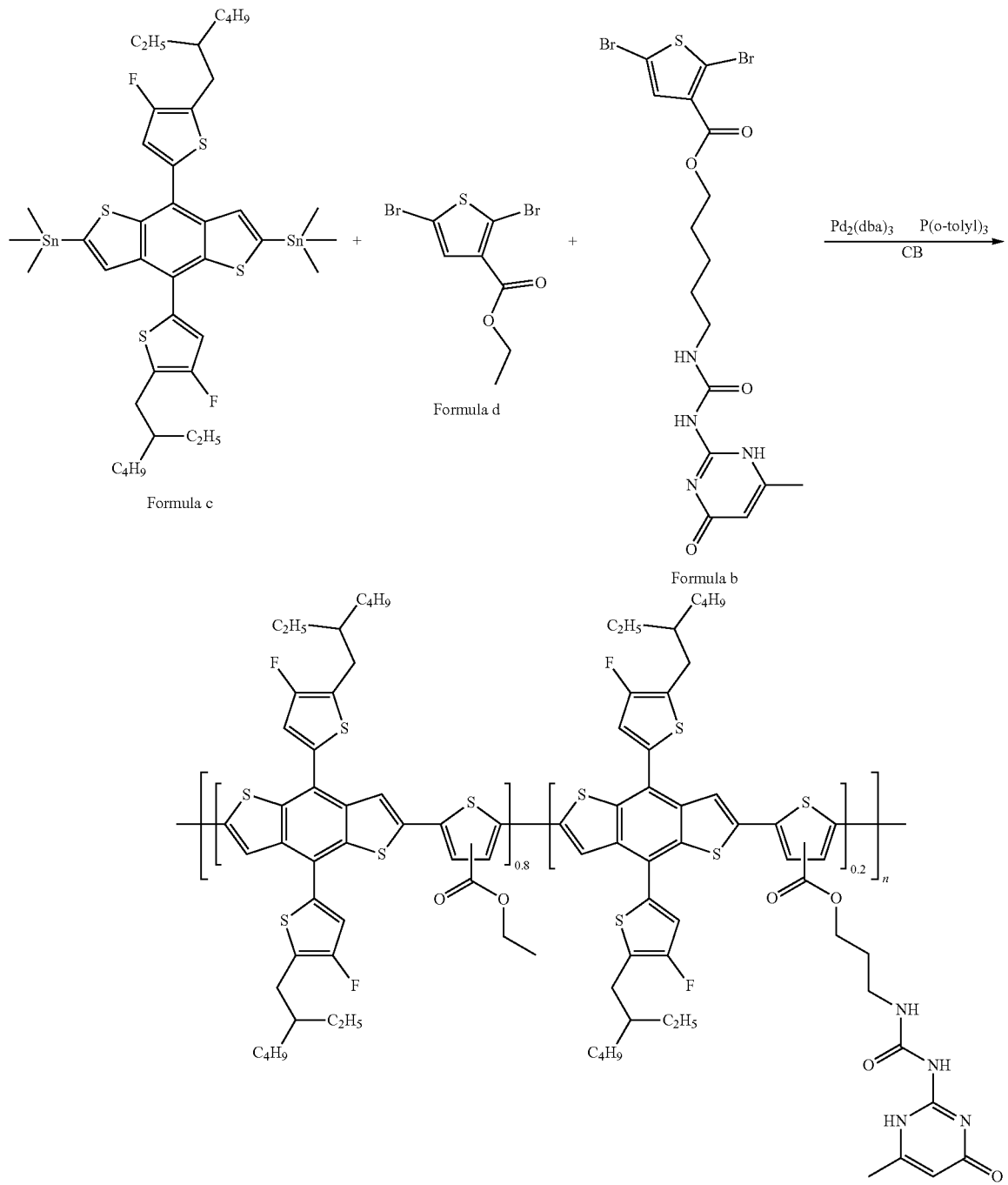

PTO2-urea 20
[Formula 2]

5-(3-(6-Methyl-4-oxo-1,4-dihydropyrimidin-2-yl)ureido) pentyl 2,5-dibromothiophene-3-carboxylate (10.4 mg, 0.02 mmol) represented by Formula b synthesized in (2) of Example 1-1, (4,8-bis(5-(2-ethylhexyl)-4-fluorothiophen-2-yl)benzo[1,2-b:4,5-b']dithiophene-2,6-diyl)bis(trimethyl-stannane) (94.0 mg, 0.1 mmol) represented by Formula c, ethyl 2,5-dibromothiophene-3-carboxylate (25.1 mg, 0.08 mmol) represented by Formula d, tris(dibenzylideneacetone)dipalladium(0) (Pd$_2$(dba)$_3$) (1.9 mg, 2.0 μmol), and tri-o-tolylphosphine (P(o-tolyl)$_3$) (4.9 mg, 16.0 μmol) were mixed and dissolved in degassed chlorobenzene (0.3 mL). The solution was allowed to react in a microwave polymerization reactor at 160° C. for 2 h, precipitated in methanol, and filtered. The precipitate was washed by Soxhlet extraction with methanol, hexane, and cyclohexane in this order, followed by extraction with chloroform. Chloroform was removed from the extract using a rotary evaporator. Then, the extract was precipitated with methanol and filtered to afford the conjugated polymer (PTO2-urea20) (73 mg, 90.3%) represented by Formula 2.

The conjugated polymer (PTO2-urea20) represented by Formula 2 was dissolved in warm chloroform or a mixture of chlorobenzene (CB) and 1,2-dichlorobenzene (DCB) at room temperature.

The molecular weight of the conjugated polymer (PTO2-urea20) represented by Formula 2 was confirmed by gel permeation chromatography (GPC) using 1,2-dichlorobenzene as the eluent at 80° C. The $M_n$ and $M_w/M_n$ of the conjugated polymer (PTO2-urea20) represented by Formula 2 were 10.8 kg/mol and 2.00, respectively.

Example 3-1. Synthesis of the Conjugated Polymer (PTO2-Urea50) Represented by Formula 3

The conjugated polymer (PTO2-urea50) represented by Formula 3 was prepared according to Scheme 3:

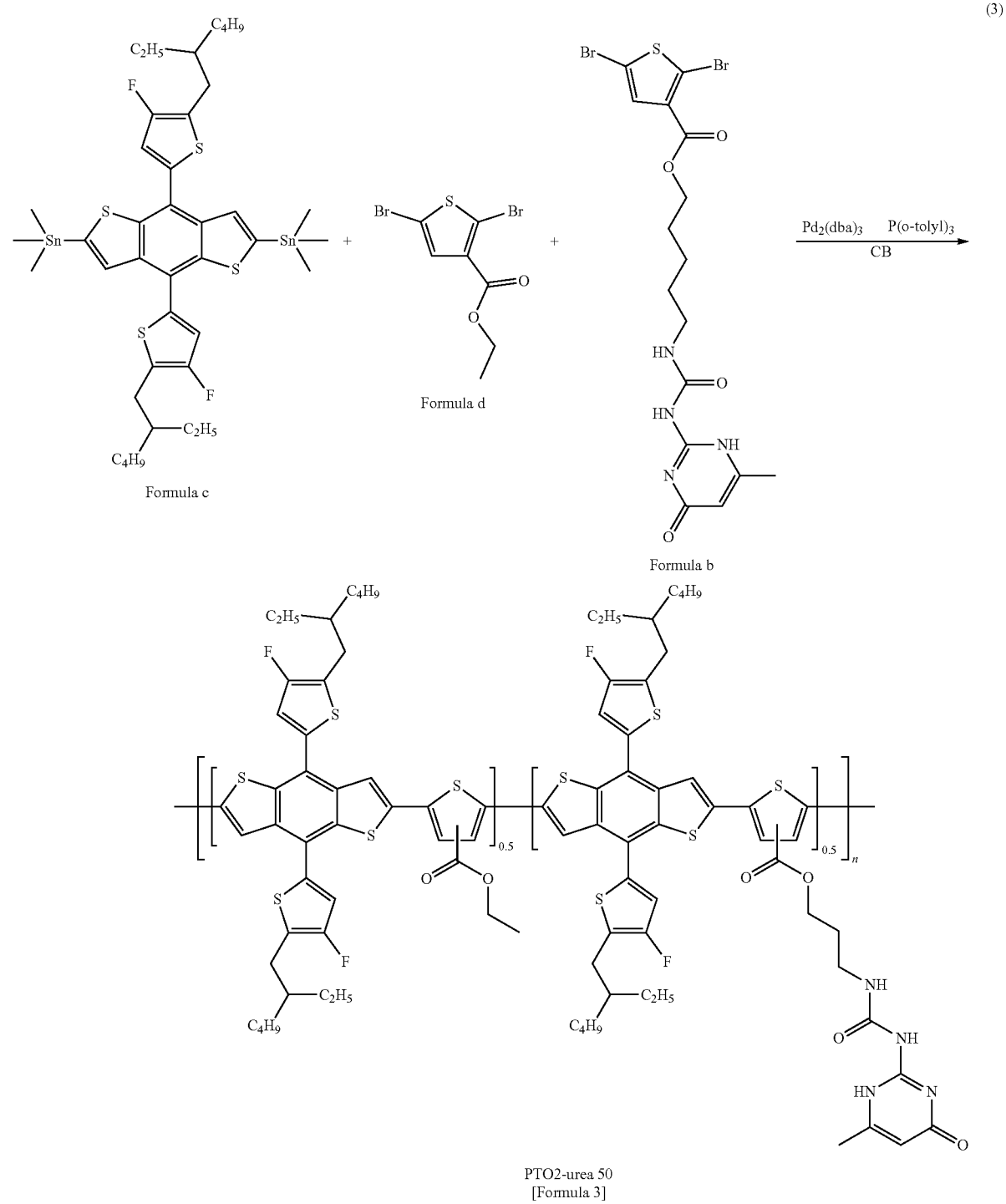

PTO2-urea 50
[Formula 3]

The compound (52.2 mg, 0.1 mmol) represented by Formula b synthesized in (2) of Example 1-1, (4,8-bis(5-(2-ethylhexyl))-4-fluorothiophen-2-yl)benzo[1,2-b:4,5-b']dithiophene-2,6-diyl)bis(trimethylstannane) (188.1 mg, 0.2 mmol) represented by Formula c, ethyl 2,5-dibromothiophene-3-carboxylate (31.4 mg, 0.1 mmol) represented by Formula d, tris(dibenzylideneacetone)dipalladium(0) ($Pd_2(dba)_3$) (3.7 mg, 4.0 mol), and tri-o-tolylphosphine ($P(o\text{-tolyl})_3$) (9.7 mg, 32.0 mol) were mixed and dissolved in degassed chlorobenzene (0.6 mL). The solution was allowed to react in a microwave polymerization reactor at 160° C. for 2 h, precipitated in methanol, and filtered. The precipitate was washed by Soxhlet extraction with methanol, hexane, and cyclohexane in this order, followed by extraction with chloroform. Chloroform was removed from the extract using a rotary evaporator. Then, the extract was precipitated with methanol and filtered to afford the conjugated polymer (PTO2-urea50) (137 mg, 78.6%) represented by Formula 3.

The conjugated polymer (PTO2-urea50) represented by Formula 3 was dissolved in warm chloroform or a mixture of chlorobenzene (CB) and 1,2-dichlorobenzene (DCB) at room temperature.

The molecular weight of the conjugated polymer (PTO2-urea50) represented by Formula 3 was confirmed by gel permeation chromatography (GPC) using 1,2-dichlorobenzene as the eluent at 80° C. The $M_n$ and $M_w/M_n$ of the conjugated polymer (PTO2-urea50) represented by Formula 3 were 9.4 kg/mol and 1.65, respectively.

Comparative Example 1-1. Synthesis of the Conjugated Polymer (PTO2) Represented by Formula 4

The conjugated polymer (PTO2) represented by Formula 4 was prepared according to Scheme 4.

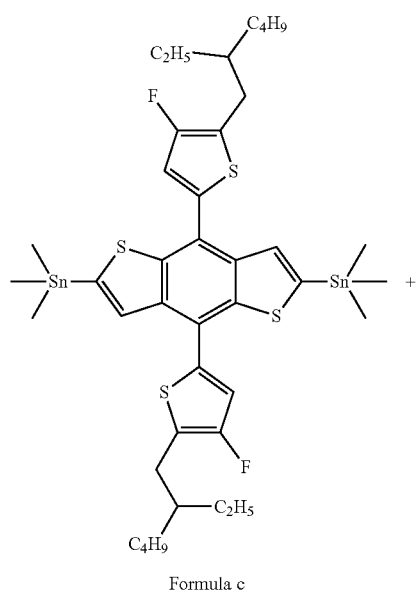

Formula c

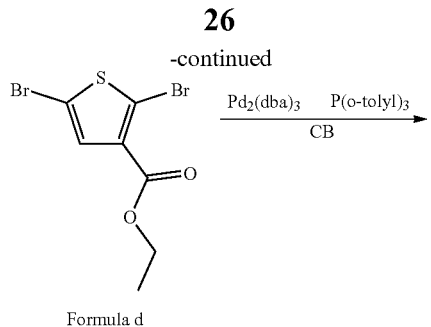

Formula d

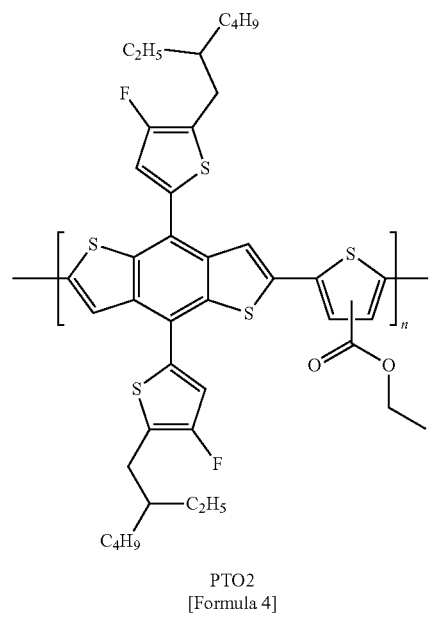

PTO2
[Formula 4]

(4,8-Bis(5-(2-ethylhexyl)-4-fluorothiophen-2-yl)benzo[1,2-b:4,5-b']dithiophene-2,6-diyl)bis(trimethylstannane) (188.1 mg, 0.2 mmol) represented by Formula c, ethyl 2,5-dibromothiophene-3-carboxylate (62.8 mg, 0.2 mmol) represented by Formula d, tris(dibenzylideneacetone)dipalladium(0) ($Pd_2(dba)_3$) (3.7 mg, 4.0 μmol), and tri-o-tolylphosphine ($P(o\text{-tolyl})_3$) (9.7 mg, 32.0 mol) were mixed and dissolved in degassed chlorobenzene (0.6 mL). The solution was allowed to react in a microwave polymerization reactor at 160° C. for 2 h, precipitated in methanol, and filtered. The precipitate was washed by Soxhlet extraction with methanol, hexane, ethyl acetate, and dichloromethane in this order, followed by extraction with chloroform. Chloroform was removed from the extract using a rotary evaporator. Then, the extract was precipitated with methanol and filtered to afford the conjugated polymer (PTO2) (86.3 mg, 56.3%) represented by Formula 4.

The conjugated polymer (PTO2) represented by Formula 4 was dissolved in warm chloroform or a mixture of chlorobenzene (CB) and 1,2-dichlorobenzene (DCB) at room temperature.

The molecular weight of the conjugated polymer (PTO2) represented by Formula 4 was confirmed by gel permeation chromatography (GPC) using 1,2-dichlorobenzene as the eluent at 80° C. The $M_n$ and $M_w/M_n$ of the conjugated polymer (PTO2) represented by Formula 4 were 52.6 kg/mol and 2.21, respectively.

<Example 1-2> Preparation of Composition for Forming Self-Healing Photoactive Layer and Production of Polymer Composite Film Using the Composition Chlorobenzene and 1,8-diiodooctane were mixed in a volume ratio of 99.5:0.5 to prepare a first solution. A mixture of 11 mg of the conjugated polymer (Formula 1) prepared in Example 1-1 and IT-4F (cas number: 2097998-59-7) in a weight ratio of 1:1 was added to 1 mL of the first solution to prepare a composition for forming a self-healing photoactive layer.

Dow Corning's Sylgard™ 184 silicone elastomer kit and a mixture of a coating agent and a molding agent in a ratio of 10:1 were used to prepare a polydimethylsiloxane (PDMS) mixed solution. The PDMS mixed solution was poured into a square Petri dish, stored at room temperature for 1 h, and dried under vacuum at 80° C. for 2 h. The resulting PDMS film was cut, attached to a glass substrate, and treated with an oxygen plasma for 30 s to form a thin PDMS film.

0.1 ml of the composition was spin coated at a rate of 1200 rpm on the thin PDMS film to obtain a glass substrate/PDMS/photoactive layer structure. The PDMS/photoactive layer film was released from the glass substrate to obtain a polymer composite film, which was used to fabricate an organic solar cell.

<Example 2-2> Preparation of Composition for Forming Self-Healing Photoactive Layer and Production of Polymer Composite Film Using the Composition A composition for forming a self-healing photoactive layer was prepared and a polymer composite film for a photoactive layer were produced in the same manner as in Example 1-2, except that the conjugated polymer (Formula 2) of Example 2-1 was used instead of the conjugated polymer (Formula 1) of Example 1-1.

<Example 3-2> Preparation of Composition for Forming Self-Healing Photoactive Layer and Production of Polymer Composite Film Using the Composition A composition for forming a self-healing photoactive layer was prepared and a polymer composite film for a photoactive layer were produced in the same manner as in Example 1-2, except that 10 mg of the conjugated polymer (Formula 3) of Example 3-1 was used instead of 11 mg of the conjugated polymer (Formula 1) of Example 1-1.

<Comparative Example 1-2> Preparation of PTO2-Based Composition for Photoactive Layer and Production of Polymer Composite Film Using the Composition A composition for forming a self-healing photoactive layer was prepared and a polymer composite film for a photoactive layer were produced in the same manner as in Example 1-2, except that 10 mg of the conjugated polymer (Formula 4) of Comparative Example 1-1 was used instead of 11 mg of the conjugated polymer (Formula 1) of Example 1-1.

<Example 1-3> Fabrication of Organic Solar Cell

An organic solar cell having an ITO/ZnO/photoactive layer/$MoO_3$/Ag structure was fabricated by the following procedure.

First, an indium-tin-oxide (ITO) substrate was washed with a dilute aqueous solution of a cleaning agent for 10 min, distilled water for 10 min, acetone for 10 min, and isopropyl alcohol for 10 min in an ultrasonic cleaner and was then dried. A zinc oxide (ZnO) solution was spin coated on the dried indium-tin-oxide (ITO) substrate and thermally treated at 200° C. for 30 min. The composition prepared in Example 1-2 was spin coated at a rate of 1200 rpm on the ZnO-coated ITO substrate at room temperature to form a photoactive layer.

$MoO_3$ was deposited to a thickness of 3 nm on the photoactive layer and silver was deposited to a thickness of 100 nm on the $MoO_3$ to form a top electrode.

<Example 2-3> Fabrication of Organic Solar Cell

An organic solar cell was fabricated in the same manner as in Example 1-3, except that the composition prepared in Example 2-2 was used instead of the composition prepared in Example 1-2.

<Example 3-3> Fabrication of Organic Solar Cell

An organic solar cell was fabricated in the same manner as in Example 1-3, except that the composition prepared in Example 3-2 was used instead of the composition prepared in Example 1-2.

<Comparative Example 1-3> Fabrication of Organic Solar Cell

An organic solar cell was fabricated in the same manner as in Example 1-3, except that the composition prepared in Comparative Example 1-2 was used instead of the composition prepared in Example 1-2.

<Example 1-4> Fabrication of Physically Damaged Organic Solar Cells

When physical damage to photoactive layers was self-healed, a determination was made as to whether electrical damage was also recovered. To this end, photoactive layers were stretched to different strains of 20% and 50% and the physically damaged photoactive layers were used to fabricate organic solar cells having an ITO/ZnO/physically damaged photoactive layer/$MoO_3$/Ag structure.

The efficiencies of the organic solar cells using the physically damaged photoactive layers were compared.

First, an indium-tin-oxide (ITO) substrate was washed with a dilute aqueous solution of a cleaning agent for 10 min, distilled water for 10 min, acetone for 10 min, and isopropyl alcohol for 10 min in an ultrasonic cleaner and was then dried. A zinc oxide (ZnO) solution was spin coated on the dried indium-tin-oxide (ITO) substrate and thermally treated at 200° C. for 30 min. The ZnO-coated ITO substrate was heated to 100° C., the polymer composite film produced in Example 1-2 was physically damaged and placed on the ZnO-coated ITO substrate, and the resulting structure was compressed using a cylinder sealing system for 10 see to transfer the PDMS side of the polymer composite film to the ITO/ZnO side.

The polymer composite film was physically damaged by fixing its both ends with holder and stretching it to stains of 20% and 50% in the axial direction to form microcracks. The physically damaged polymer composite film was used immediately after the physical damage. The strain was defined as the ratio of the stretched length to the unstretched length of the polymer composite film.

MoO$_3$ was deposited to a thickness of 3 nm on the photoactive layer and silver was deposited to a thickness of 100 nm on the MoO$_3$ to form a top electrode.

<Example 2-4> Fabrication of Physically Damaged Organic Solar Cells

Organic solar cells were fabricated in the same manner as in Example 1-4, except that the composition prepared in Example 2-2 was used instead of the composition prepared in Example 1-2.

<Example 3-4> Fabrication of Physically Damaged Organic Solar Cells

Organic solar cells were fabricated in the same manner as in Example 1-4, except that the composition prepared in Example 3-2 was used instead of the composition prepared in Example 1-2.

<Comparative Example 1-4> Fabrication of Physically Damaged Organic Solar Cells

Organic solar cells were fabricated in the same manner as in Example 1-4, except that the composition prepared in Comparative Example 1-2 was used instead of the composition prepared in Example 1-2.

<Experimental Example 1> Evaluation of Self-Healing Properties of the Polymer Composite Films-1

The polymer composite films produced in Comparative Example 1-2 and Examples 1-2, 2-2, and 3-2 were stretched to strains of 20%, 50%, and 70% to form microcracks. The densities of microcracks in the photoactive layers were confirmed with an optical microscope. Time-dependent changes in the density of microcracks were measured to compare the degrees of recovery of the polymer composite films from the damage caused by stretching.

Figure 2:
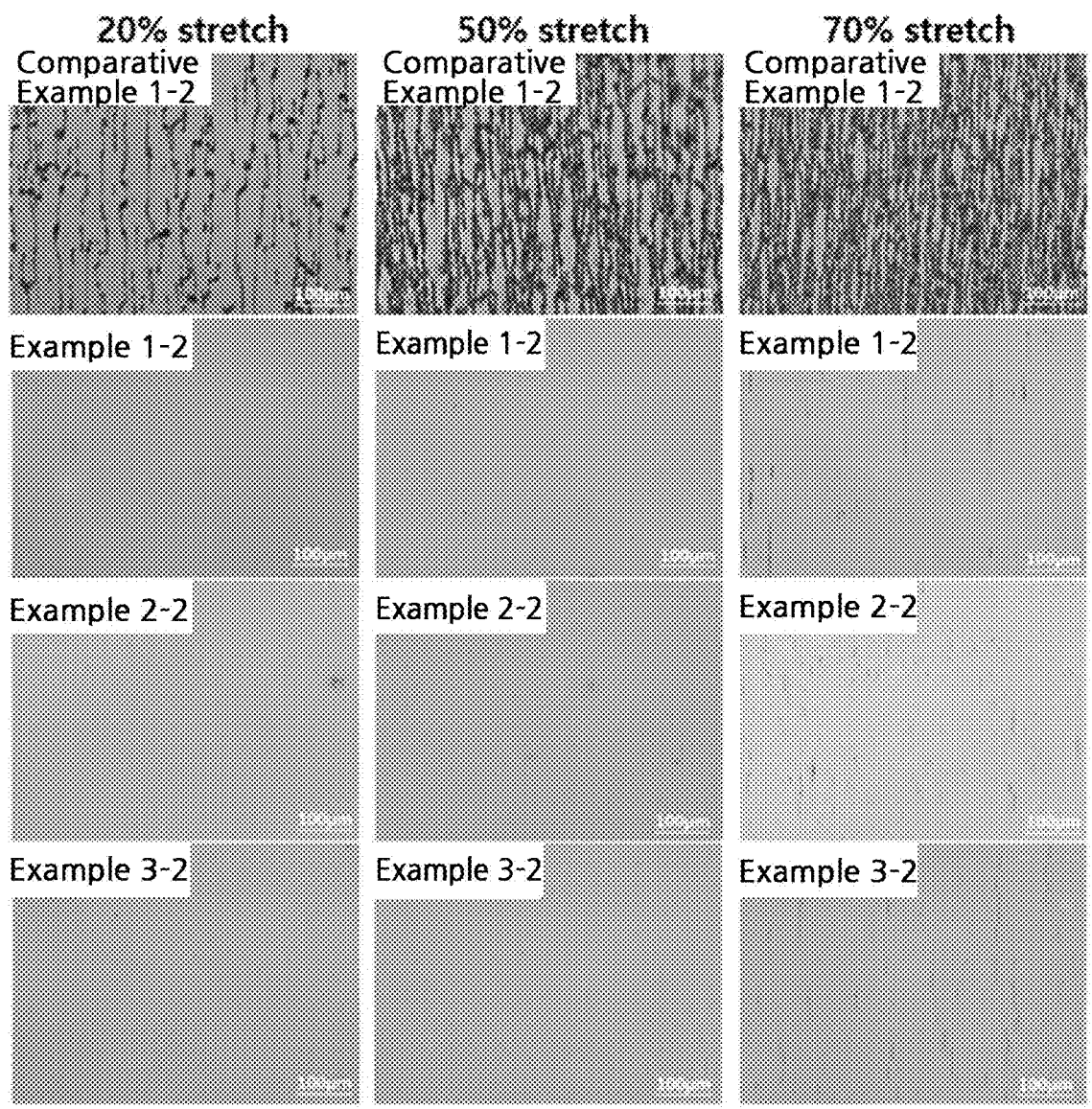
FIG. 2 shows optical microscopy images of polymer composite films for photoactive layers produced in Comparative Example 1-2 and Examples 1-2, 2-2, and 3-2 after stretching to strains of 20%, 50%, and 70%.

FIG. 2 shows optical microscopy images of the polymer composite films produced in Comparative Example 1-2 and Examples 1-2, 2-2, and 3-2 after stretching to strains of 20%, 50%, and 70%.

Figure 3:
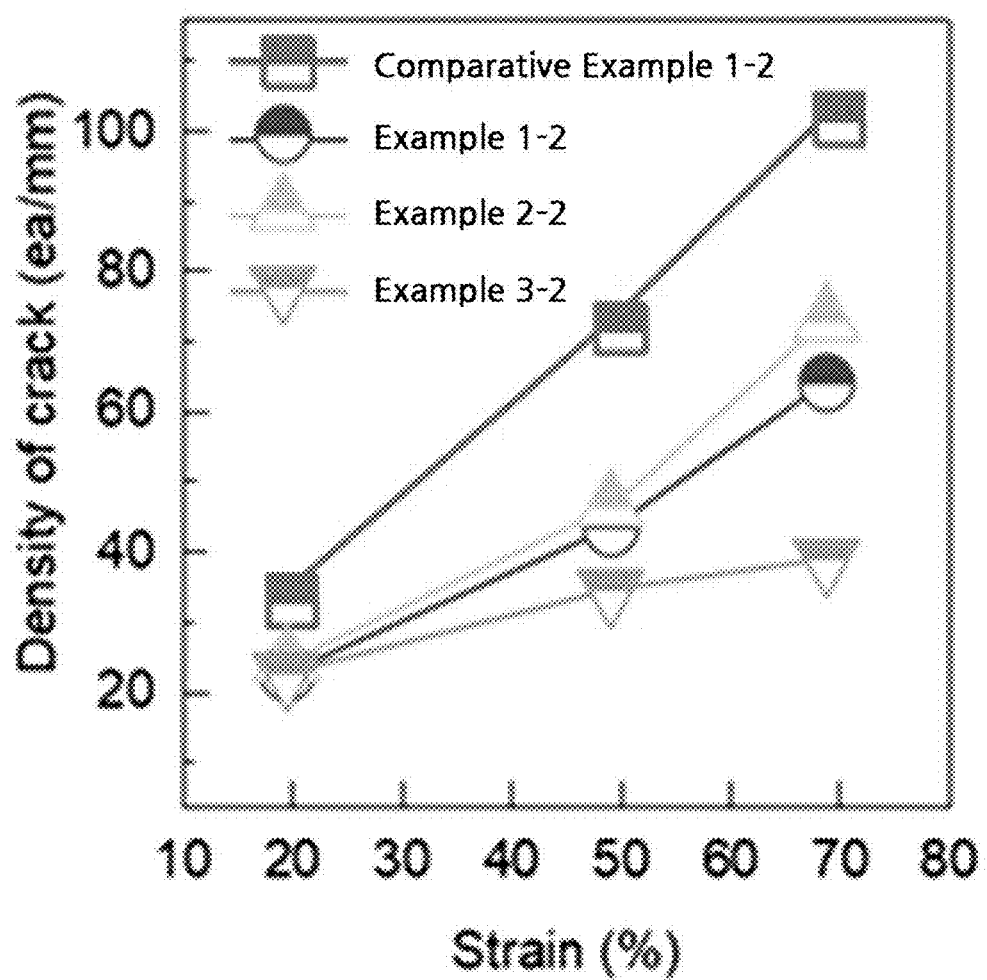
FIG. 3 shows the numbers of cracks per unit length in polymer composite films for photoactive layers produced in Comparative Example 1-2 and Examples 1-2, 2-2, and 3-2 after stretching to strains of 20%, 50%, and 70%, which were measured from FIG. 2, as a function of strain.

FIG. 3 shows the numbers of cracks per unit length in the polymer composite films produced in Comparative Example 1-2 and Examples 1-2, 2-2, and 3-2 after stretching to strains of 20%, 50%, and 70%, which were measured from FIG. 2, as a function of strain. FIGS. 2 and 3 reveal that the numbers of cracks per unit length in the polymer composite films of Example 1-2, Example 2-2, Example 3-2, and Comparative Example 1-2 increased with increasing strain.

As can be seen from FIGS. 2 and 3, the numbers of cracks in the polymer composite films of Examples 1-2, 2-2, and 3-2 were smaller than those in the polymer composite film of Comparative Example 1-2. Particularly, the smallest numbers of cracks were observed in the polymer composite film of Examples 3-2. In conclusion, it is most preferable that the molar ratio of x to y in Formula I is 1:1, where damage caused by mechanical stress is minimized.

<Experimental Example 2> Evaluation of Self-Healing Properties of the Polymer Composite Films-2

Figure 4:
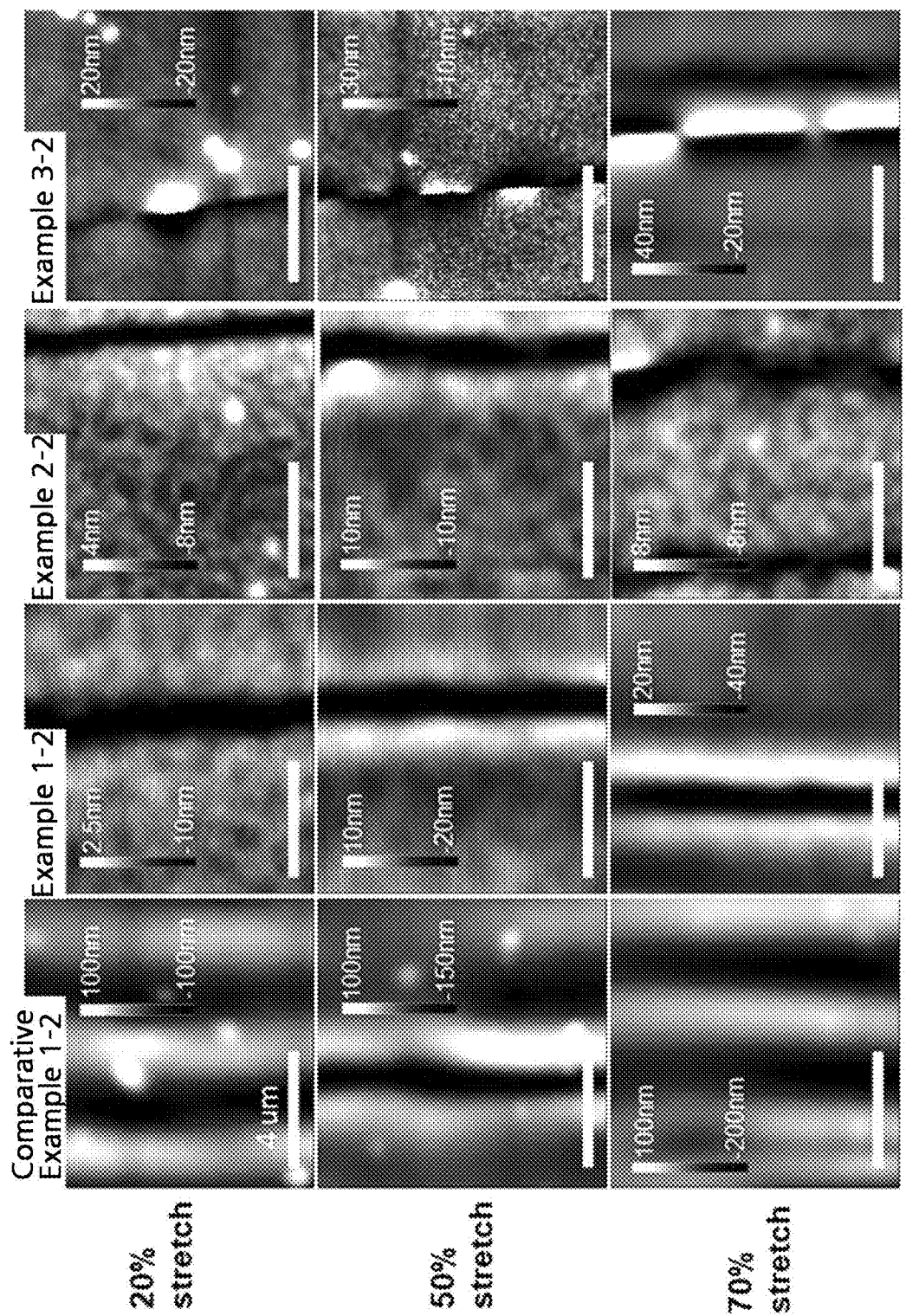
FIG. 4 shows surface microcracks in polymer composite films for photoactive layers produced in Comparative Example 1-2 and Examples 1-2, 2-2, and 3-2 after stretching to strains of 20%, 50%, and 70%, which were taken by atomic force microscopy.

FIG. 4 shows surface microcracks in the polymer composite films produced in Comparative Example 1-2 and Examples 1-2, 2-2, and 3-2 after stretching to strains of 20%, 50%, and 70%, which were taken by atomic force microscopy.

Figure 5:
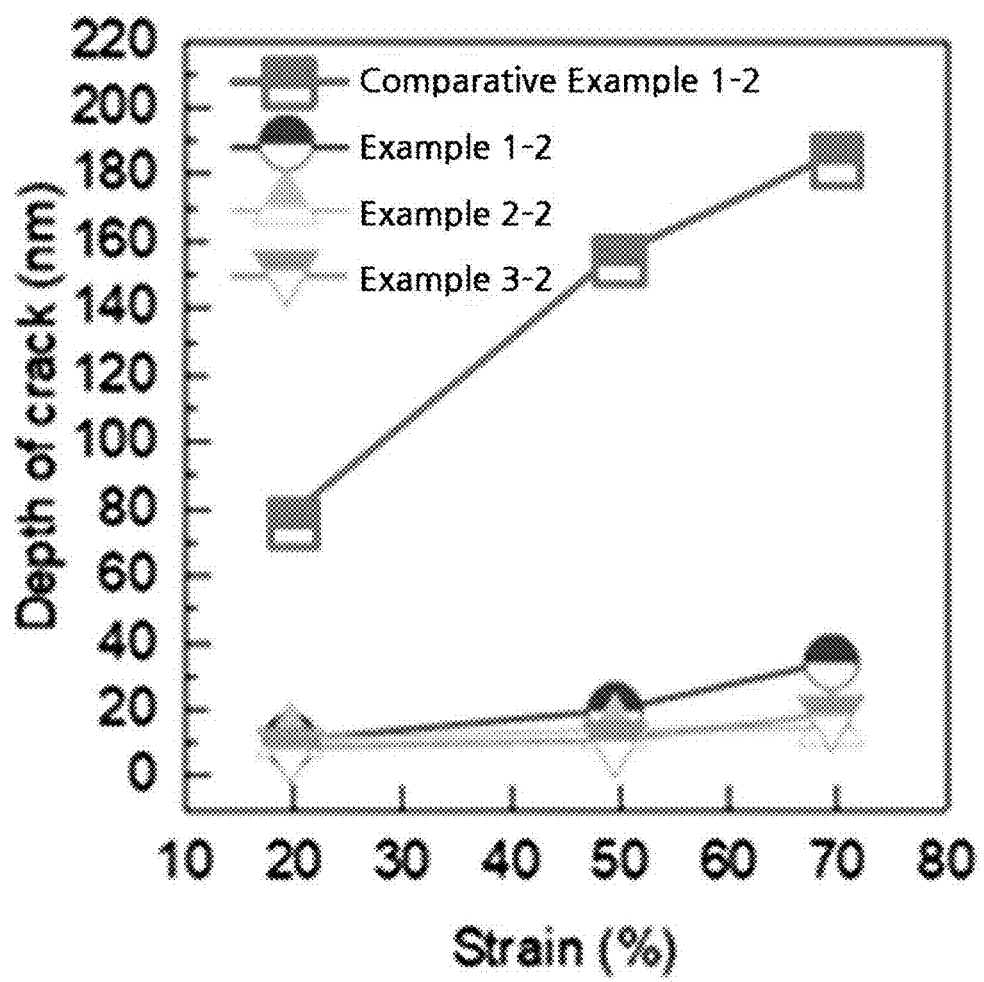
FIG. 5 shows the depths of surface microcracks in polymer composite films for photoactive layers produced in Comparative Example 1-2 and Examples 1-2, 2-2, and 3-2 after stretching to strains of 20%, 50%, and 70%, which were measured from FIG. 4, as a function of strain.

FIG. 5 shows the depths of surface microcracks in the polymer composite films produced in Comparative Example 1-2 and Examples 1-2, 2-2, and 3-2 after stretching to strains of 20%, 50%, and 70%, which were measured from FIG. 4, as a function of strain.

Referring to FIGS. 4 and 5, the depths of the microcracks in the polymer composite films produced in Comparative Example 1-2 and Examples 1-2, 2-2, and 3-2 increased with increasing strain.

Specifically, the microcracks formed in the polymer composite film of Comparative Example 1-2 were 80-200 nm deep, whereas the microcracks formed in the polymer composite films of Examples 1-2, 2-2, and 3-2 were 4 times shallower (1-40 nm deep). Particularly, the shallowest microcracks (1-20 nm) was observed in the polymer composite film of Example 3-2. These results indicate that the presence of the self-healing conjugated polymers leads to 4 times less damage by stretching and ensures better self-healing properties (including faster self-recovery and restoration) of the polymer composite films of Examples 1-2, 2-2, and 3-2, enabling long-term use of the polymer composite films.

Figure 6:
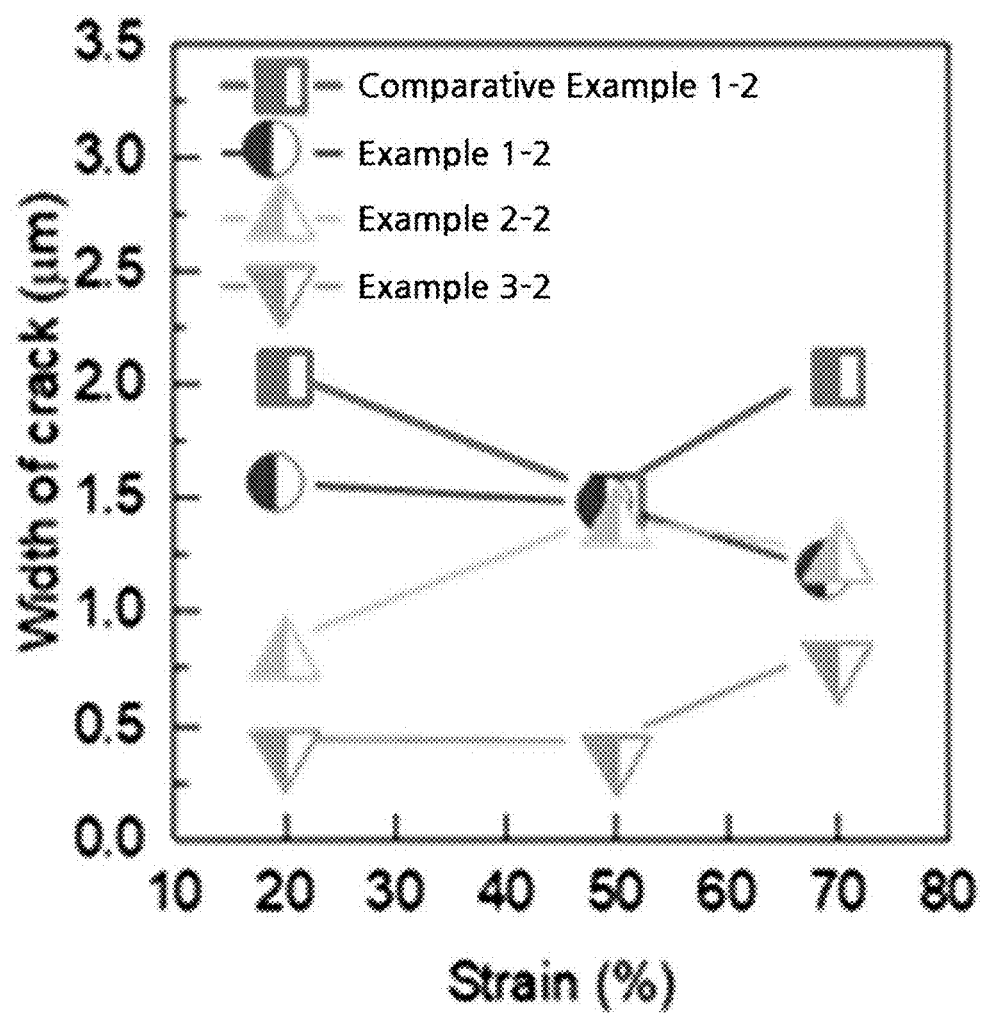
FIG. 6 shows the widths of surface microcracks in polymer composite films for photoactive layers produced in Comparative Example 1-2 and Examples 1-2, 2-2, and 3-2 after stretching to strains of 20%, 50%, and 70%, which were measured from FIG. 4, as a function of strain.

FIG. 6 shows the widths of surface microcracks in the polymer composite films produced in Comparative Example 1-2 and Examples 1-2, 2-2, and 3-2 after stretching to strains of 20%, 50%, and 70%, which were measured from FIG. 4, as a function of strain.

Referring to FIG. 6, the microcracks formed in the polymer composite film of Comparative Example 1-2 were wider than those formed in the polymer composite films of Examples 1-2, 2-2, and 3-2. Particularly, the narrowest microcracks were observed in the polymer composite film of Example 3-2 stretched to 20-70% strains. The microcracks formed in the polymer composite film of Example 3-2 were at least two times narrower than those formed in the polymer composite films of Examples 1-2 and 2-2 and were at least four times narrower than those formed in the polymer composite film of Comparative Example 1-2.

Figure 7:
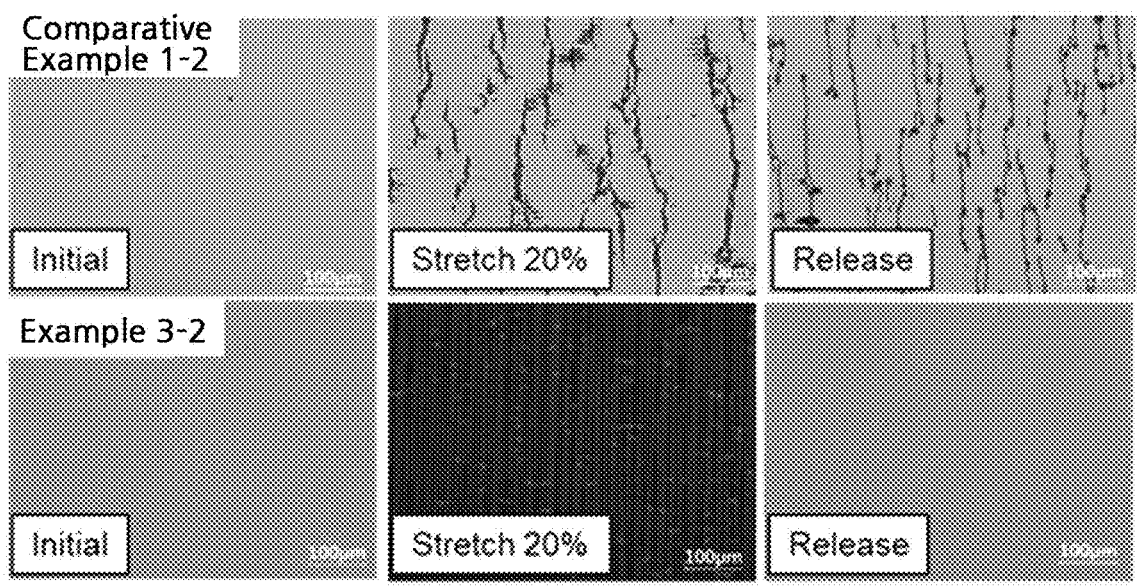
FIG. 7 shows optical microscopy images of polymer composite films for photoactive layers produced in Comparative Example 1-2 and Example 3-2 before stretching ("Initial"), after stretching to a strain of 20% in the transverse direction ("Stretch 20%"), and after release of the stretching stress ("Release")

FIG. 7 shows optical microscopy images of the polymer composite films produced in Comparative Example 1-2 and Example 3-2 before stretching ("Initial"), after stretching to a strain of 20% in the transverse direction ("Stretch 20%"), and after release of the stretching stress ("Release").

Referring to FIG. 7, deep and large microcracks were observed in the polymer composite film of Comparative Example 1-2 stretched to a strain of 20%. When the stretching stress disappeared, the microcracks decreased in width but remained without recovery.

In contrast, shallow and small cracks were observed in the polymer composite film of Example 3-2 stretched to a strain of 20%. When the stretching stress disappeared, the cracks were completely recovered, demonstrating that the polymer composite film self-healed the damage and was restored to its initial surface.

<Experimental Example 3> Characterization of the Organic Solar Cells

The current-voltage characteristics of the organic solar cells fabricated in Comparative Example 1-3 and Examples 1-3, 2-3, and 3-3 were measured under simulated sunlight with an intensity of 0.100 mW/cm$^2$ and the fill factors and power conversion efficiencies of the organic solar cells were calculated from Equations 1 and 2. The results are summarized in FIG. 8 and Table 1.

$$\text{Fill factor} = (V_{mp} \times J_{mp})/(V_{OC} \times J_{SC}) \quad (1)$$

$$\text{Power conversion efficiency}(PCE, \%) = \{(\text{Fill factor} \times J_{SC} \times V_{OC})/P_{in}\}/100 \quad (2)$$

where $V_{mp}$ and $J_{mp}$ are the voltage and current values at the maximum power point when the current-voltage characteristics of each organic solar cell were measured, respectively, $J_{SC}$ is the short-circuit current density, $V_{OC}$ is the open-circuit voltage, and $P_{in}$ (100 mW/cm$^2$) is the power density of incident light.

Figure 8:
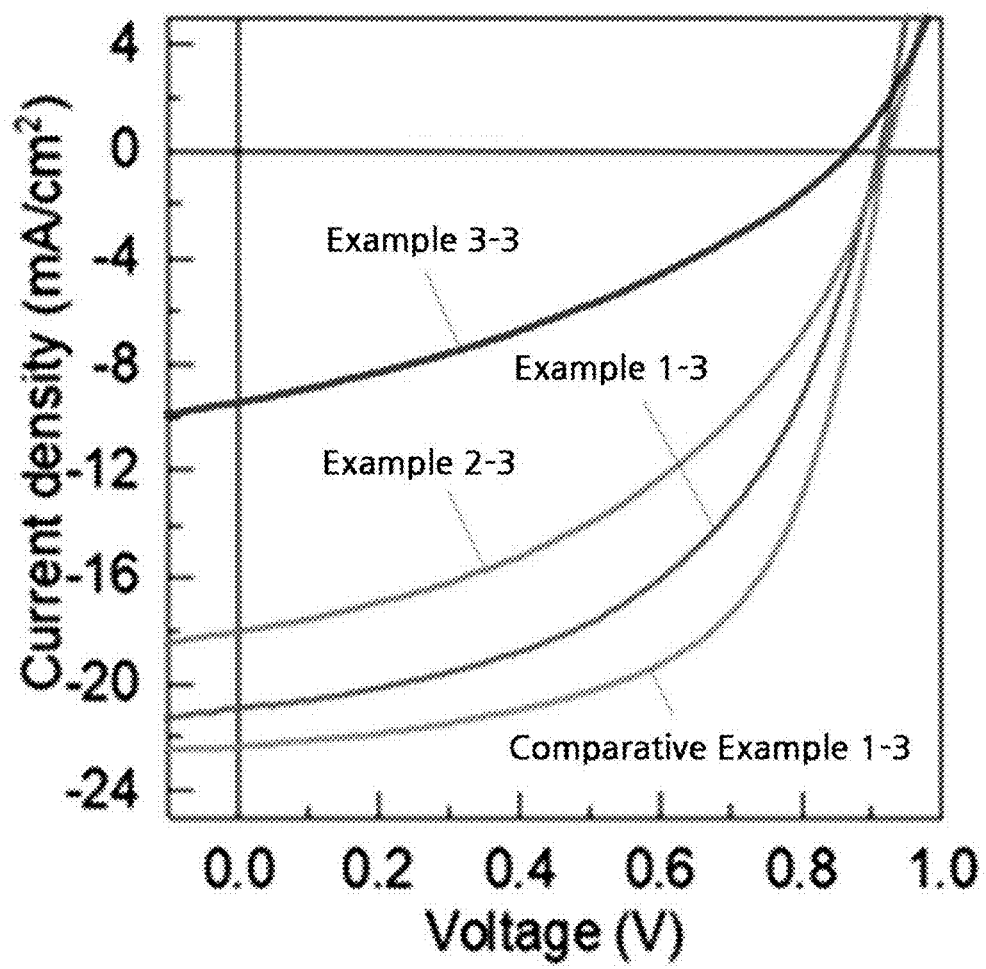
FIG. 8 shows current density-voltage (J-V) curves of organic solar cells fabricated in Comparative Example 1-3 and Examples 1-3, 2-3, and 3-3.

FIG. 8 shows current density-voltage (J-V) curves of the organic solar cells fabricated in Comparative Example 1-3 and Examples 1-3, 2-3, and 3-3 and the results shown in FIG. 8 are summarized in Table 1.

TABLE 1

|  | Open-circuit voltage ($V_{oc}$, V) | Short-circuit current density ($J_{SC}$, mA/cm$^2$) | Fill factor (FF) | Power conversion efficiency (PCE, %) |
| --- | --- | --- | --- | --- |
| Comparative Example 1-3 (PTO2) | 0.92 | 22.2 | 59.3 | 12.2 |
| Example 1-3 (PTO2-Urea10) | 0.93 | 20.9 | 51 | 10.0 |
| Example 2-3 (PTO2-Urea20) | 0.94 | 18.2 | 44.2 | 7.59 |
| Example 3-3 (PTO2-Urea50) | 0.78 | 10.9 | 35.3 | 3.07 |

Referring to FIG. 8 and Table 1, the short-circuit current density and power conversion efficiency of the organic solar cell of Example 1-3 were 20.9 mA/cm$^2$ and 10.0%, respectively.

The performance of each of the organic solar cells of Examples 1-3, 2-3, and 3-3 was found to slightly decrease as the molar fraction of the self-healing functional groups in the conjugated polymer increased. The organic solar cells of Examples 1-3 and 2-3 achieved efficiencies of 82 and 62%, which were high compared to the organic solar cell of Comparative Example 1-3. These results indicate that despite the presence of a large number of insulating self-healing functional groups in the inventive conjugated polymers, the use of the conjugated polymers led to less reduction or loss in the formation of charge carriers and charge mobility in the photoactive layers.

As demonstrated above, external force (for example, stretching stress) caused little or no damage to (few or no cracks in) the photoactive layers using the inventive conjugated polymers with excellent self-recovery properties. To sum up, the conjugated polymer of the present invention is suitable for use in a photoactive layer for an organic solar cell due to its excellent electrical properties and self-healing ability. In addition, an organic solar cell including a photoactive layer formed using the conjugated polymer of the present invention has markedly improved lifetime and long-term stability as well as high power conversion efficiency compared to conventional organic solar cells.

<Experimental Example 4> Comparison of Characteristics of the Physically Damaged Organic Solar Cells The power conversion efficiencies of the physically damaged organic solar cells fabricated in Examples 1-4, 2-4, 3-4 and Comparative Example 1-4 were measured under simulated sunlight with an intensity of 100 mW/cm$^2$ and were compared with those of the intact organic solar cells fabricated in Comparative Example 1-3 and Examples 1-3, 2-3, and 3-3.

Figure 9:
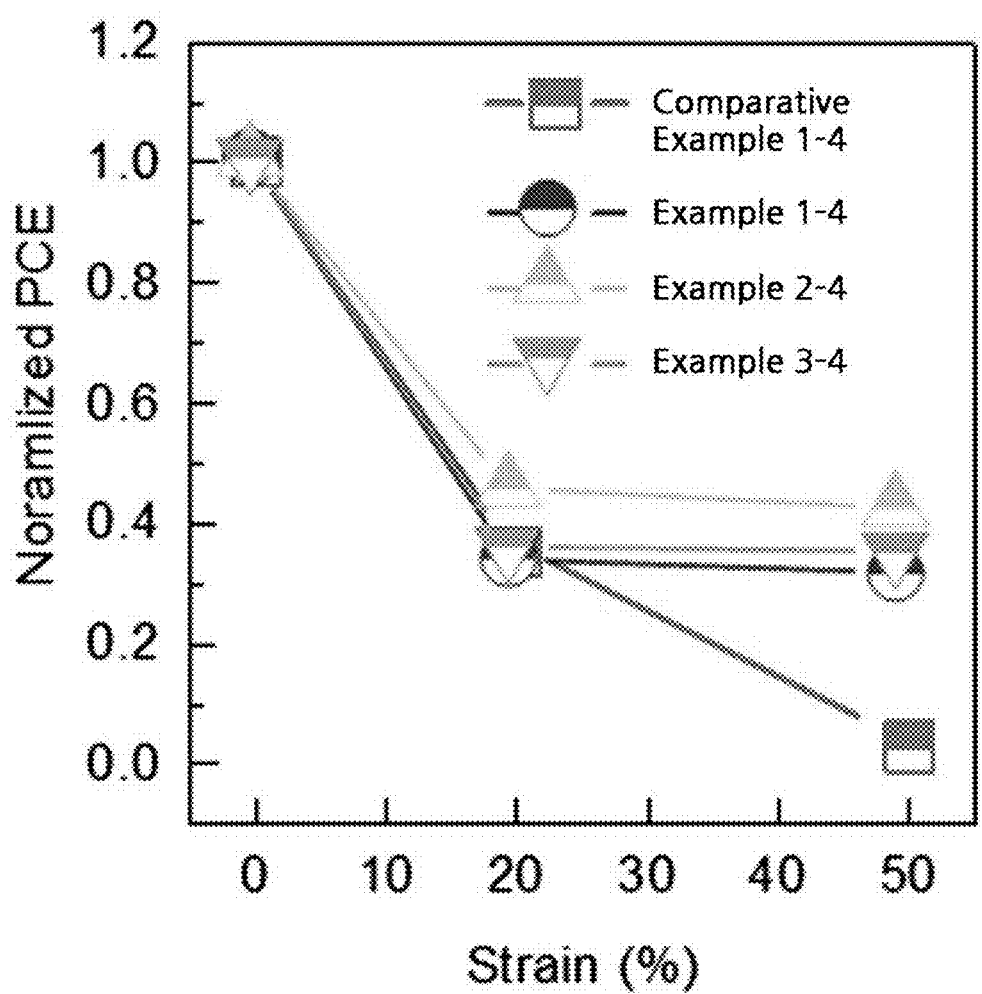
FIG. 9 shows relative power conversion efficiencies of organic solar cells fabricated in Examples 1-4, 2-4, and 3-4 and Comparative Example 1-4.

FIG. 9 shows the relative power conversion efficiencies of the physically damaged organic solar cells fabricated in Examples 1-4, 2-4, and 3-4 and Comparative Example 1-4. The relative power conversion efficiencies were normalized to the power conversion efficiencies of the intact organic solar cells.

Referring to FIG. 9, the organic solar cells of Comparative Example 1-4 and Examples 1-4 and 3-4, which were physically damaged by stretching to 20% strains, showed ~35% efficiency reductions compared to the undamaged organic solar cells of Comparative Example 1-3 and Examples 1-3 and 3-3.

However, the organic solar cell fabricated in Example 2-4 showed a 45% higher efficiency than the undamaged organic solar cell fabricated in Example 2-3 despite its physical damage by stretching to a 20% strain.

In contrast, the organic solar cell of Comparative Example 1-4, which was physically damaged by stretching to a 50% strain, achieved a low efficiency (<3%) compared to the undamaged organic solar cell of Comparative Example 1-3. The organic solar cells of Examples 1-4 and 3-4, showed efficiencies of ≥30% and the organic solar cell of Example 2-4 showed an efficiency of ≥40%. These results can lead to the conclusion that the conjugated polymer of the present invention recovers its physical and electrical properties from physical damage. In addition, the use of the conjugated polymer according to the present invention can secure and maintain the power conversion efficiency of a solar cell to some extent even when a photoactive layer of the solar cell is physically damaged by external force or stress.

What is claimed is:

1. A self-healing conjugated polymer represented by Formula I:

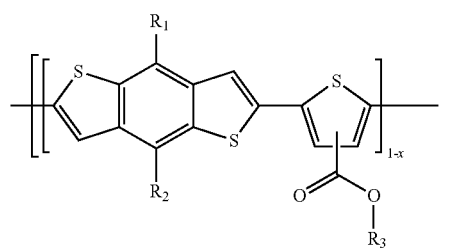

wherein $R_1$, $R_2$, $R_4$, and $R_5$ are identical to or different from each other and are each independently a group represented by Structure 1:

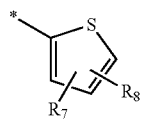

(wherein $R_7$ and $R_8$ are identical to or different from each other and are each independently selected from hydrogen atoms, halogen atoms, cyano groups, nitro groups, hydroxyl groups, amide groups, ester groups, ketone groups, thioester groups, silyl groups, and substituted or unsubstituted $C_1$-$C_{30}$ alkyl groups and the asterisk (*) represents a bonding site to the backbone), $R_3$ is selected from the group consisting of substituted or unsubstituted $C_1$-$C_6$ alkyl groups, substituted or unsubstituted $C_7$-$C_{30}$ alkyl groups, substituted or unsubstituted $C_5$-$C_{35}$ alkylthionyl groups, and substituted or unsubstituted $C_3$-$C_{30}$ cycloalkyl groups, $R_6$ is a $C_1$-$C_{10}$ alkylene group, x is real number satisfying $0.1 \leq x \leq 0.9$, and n is an integer from 5 to 100,000.

2. The self-healing conjugated polymer according to claim 1, wherein $R_1$, $R_2$, $R_4$, and $R_5$ are identical to each other, $R_7$ represents a 2-butyl-2-ethyl-1-ethyl group, $R_8$ represents a fluoro group, $R_3$ represents an ethyl group, and $R_6$ represents a 1,5-penthylene group.

3. The self-healing conjugated polymer according to claim 1, wherein the conjugated polymer has a number average molecular weight ($M_n$) of 1 to 100 kg/mol and a polydispersity (PD) ($M_w/M_n$) of 1 to 3.

4. The self-healing conjugated polymer according to claim 1, wherein x is real number satisfying $0.8 \leq x \leq 0.9$.

5. A composition for forming a self-healing photoactive layer, comprising a solvent and a conjugated polymer represented by Formula I:

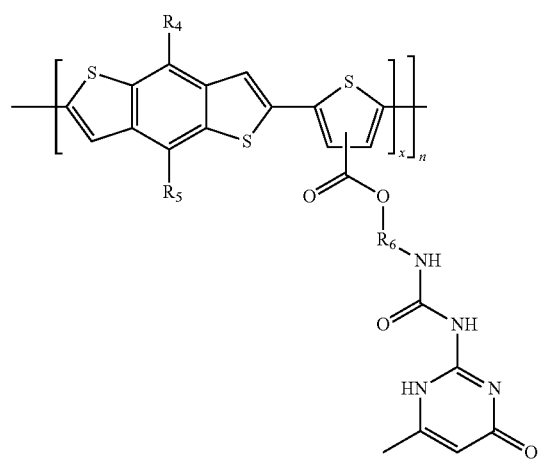

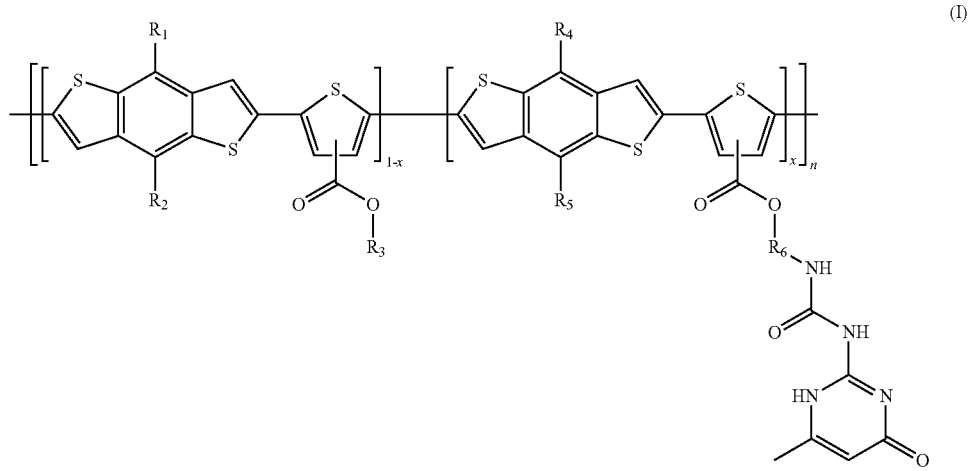

wherein $R_1$, $R_2$, $R_4$, and $R_5$ are identical to or different from each other and are each independently a group represented by Structure 1:

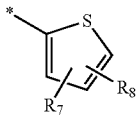

(1)

(wherein $R_7$ and $R_8$ are identical to or different from each other and are each independently selected from hydrogen atoms, halogen atoms, cyano groups, nitro groups, hydroxyl groups, amide groups, ester groups, ketone groups, thioester groups, silyl groups, and substituted or unsubstituted $C_1$-$C_{30}$ alkyl groups and the asterisk (*) represents a bonding site to the backbone), $R_3$ is selected from the group consisting of substituted or unsubstituted $C_1$-$C_6$ alkyl groups, substituted or unsubstituted $C_7$-$C_{30}$ alkyl groups, substituted or unsubstituted $C_5$-$C_{35}$ alkylthionyl groups, and substituted or unsubstituted $C_3$-$C_{30}$ cycloalkyl groups, $R_6$ is a $C_1$-$C_{10}$ alkylene group, x is real number satisfying 0.1≤x≤0.9, and n is an integer from 5 to 100,000.

6. The composition according to claim 5, wherein $R_1$, $R_2$, $R_4$, and $R_5$ are identical to each other, $R_7$ represents a 2-butyl-2-ethyl-1-ethyl group, $R_8$ represents a fluoro group, $R_3$ represents an ethyl group, and $R_6$ represents a 1,5-penthylene group and wherein the solvent is selected from the group consisting of dimethylformamide, dichloromethane, chloroform, hexane, cyclohexane, toluene, xylene, chlorobenzene, dichlorobenzene, ethylene acetate, tetrahydrofuran, N-methylpyrrolidinone, and mixtures thereof.

7. The composition according to claim 5, further comprising n-type molecules.

8. The composition according to claim 7, wherein the n-type molecules are selected from the group consisting of 3,9-bis(2-methylene-(3-(1,1-dicyanomethylene)-indanone))-5,5,11,11-tetrakis(4-hexylphenyl)-dithieno[2,3-d:2',3'-d]-s-indaceno[1,2-b:5,6-b']dithiophene (ITIC), 3,9-bis(2-methylene-(5,6-difluoro-3-oxo-2,3-dihydro-1H-inden-1-ylidene)malononitrile)-5,5,11,11-tetrakis(4-hexylphenyl)-dithieno[2,3-d:2',3'-d']-s-indaceno[1,2-b:5,6-b']dithiophene (IT-4F), (5Z,5'Z)-5,5'-(((4,4,9,9-tetraoctyl-4,9-dihydro-s-indaceno[1,2-b:5,6-b']dithiophene-2,7-diyl)bis(benzo[c][1,2,5]thiadiazole-7,4-diyl))bis(methanylylidene))bis(3-ethyl-2-thioxothiazolidin-4-one) (O-IDTBR), 2,2'-((2Z,2'Z)-(((4,4,9,9-tetrakis(4-hexylphenyl)-4,9-dihydro-sindaceno[1,2-b:5,6-b']dithiophene-2,7-diyl)bis(4-((2-ethylhexyl)oxy)thiophene-5,2-diyl))bis(methanylylidene))bis(5,6-difluoro-3-oxo-2,3-dihydro-1H-indene-2,1-diylidene))dimalononitrile (IEICO-4F), 5,5'-(9,9'-spirobi[fluorene]-2,7-diyl)bis(2,9-dimethylanthra[2,1,9-def:6,5,10-de'f]diisoquinoline-1,3,8,10(2H,9H)-tetraone) (SF-PDI$_2$), (2,20-((2Z,20Z)-((12,13-bis(2-ethylhexyl)-3,9-diundecyl-12,13-dihydro-[1,2,5]thiadiazolo[3,4-e]thieno[2",3':4',5']thieno[2',3':4,5]pyrrolo[3,2-g]thieno[2',3':4,5]thieno[3,2-b]indole-2,10-diyl)bis(methanylylidene))bis(5,6-difluoro-3-oxo-2,3-dihydro-1H-indene-2,1-diylidene))dimalononitrile) (Y6), (6,6)-phenyl-C61-butyric acid methyl ester ($C_{60}$-PCBM), (6,6)-phenyl-C71-butyric acid methyl ester ($C_{70}$-PCBM), bis(1-[3-(methoxycarbonyl)propyl]-1-phenyl) (Bis-$C_{60}$-PCBM), 3'-phenyl-3'H-cyclopropa(8,25)(5,6)fullerene-C70-bis-D5h(6)-3'-butyric acid methyl ester (Bis-$C_{70}$-PCBM), indene-C60-bisadduct (ICBA), monoindenyl C60 (ICMA) molecules, and combinations thereof.

9. A photoactive layer for an organic solar cell comprising the composition according to claim 5.

10. An organic solar cell employing the photoactive layer according to claim 9.

11. The organic solar cell according to claim 10, wherein the organic solar cell comprises a substrate, a first electrode disposed on the substrate, a buffer layer disposed on the first electrode, the photoactive layer disposed on a charge transport layer, and a second electrode disposed on the photoactive layer.

* * * * *